(12) United States Patent
Pandey et al.

(10) Patent No.: US 12,595,560 B2
(45) Date of Patent: *Apr. 7, 2026

(54) METHOD AND APPARATUS FOR SUPPLYING IMPROVED GAS FLOW TO A PROCESSING VOLUME OF A PROCESSING CHAMBER

(71) Applicant: Applied Materials, Inc., Santa Clara, CA (US)

(72) Inventors: Vishwas Kumar Pandey, Madhya Pradesh (IN); Eric Kihara Shono, San Mateo, CA (US); Kartik Shah, Saratoga, CA (US); Christopher S. Olsen, Fremont, CA (US); Agus Sofian Tjandra, Milpitas, CA (US); Tobin Kaufman-Osborn, Sunnyvale, CA (US); Taewan Kim, San Jose, CA (US); Hansel Lo, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 237 days.

This patent is subject to a terminal disclaimer.

(21) Appl. No.: 18/205,415

(22) Filed: Jun. 2, 2023

(65) Prior Publication Data

US 2023/0407471 A1 Dec. 21, 2023

Related U.S. Application Data

(63) Continuation of application No. 16/662,134, filed on Oct. 24, 2019, now Pat. No. 11,732,355.

(Continued)

(51) Int. Cl.
*C23C 16/452* (2006.01)
*B01F 23/10* (2022.01)
(Continued)

(52) U.S. Cl.
CPC ............ *C23C 16/452* (2013.01); *B01F 23/10* (2022.01); *B01F 23/19* (2022.01); *B01F 25/102* (2022.01);
(Continued)

(58) Field of Classification Search
CPC ............ C23C 16/452; C23C 16/45536; C23C 16/45548; C23C 16/45561; B01F 23/10;
(Continued)

(56) References Cited

U.S. PATENT DOCUMENTS 3,663,283 A 5/1972 Hebert et al.
4,092,013 A 5/1978 Staaf
(Continued)

FOREIGN PATENT DOCUMENTS

CN 101068614 A 11/2007
CN 101313085 A 11/2008
(Continued)

OTHER PUBLICATIONS

Office Action for Chinese Application No. 201980082954.2 dated Jun. 15, 2023.
(Continued)

*Primary Examiner* — Jeffrie R Lund
(74) *Attorney, Agent, or Firm* — Patterson + Sheridan, LLP

(57) ABSTRACT

The present disclosure generally provides methods of providing at least metastable radical molecular species and/or radical atomic species to a processing volume of a process chamber during an electronic device fabrication process, and apparatus related thereto. In one embodiment, the apparatus is a gas injection assembly disposed between a remote plasma source and a process chamber. The gas injection assembly includes a body, a dielectric liner disposed in the body that defines a gas mixing volume, a first flange to (Continued)

couple the gas injection assembly to a process chamber, and a second flange to couple the gas injection assembly to the remote plasma source. The gas injection assembly further includes one or more gas injection ports formed through the body and the liner.

20 Claims, 17 Drawing Sheets

Related U.S. Application Data

(60) Provisional application No. 62/782,551, filed on Dec. 20, 2018.

(51) Int. Cl.

| | |
|---|---|
| *B01F 25/10* | (2022.01) |
| *B01F 25/314* | (2022.01) |
| *B01F 25/421* | (2022.01) |
| *B01F 35/511* | (2022.01) |
| *C23C 16/455* | (2006.01) |
| *H01J 37/32* | (2006.01) |
| *H01L 21/67* | (2006.01) |

(52) U.S. Cl.
CPC .... *B01F 25/3141* (2022.01); *B01F 25/31423* (2022.01); *B01F 25/421* (2022.01); *B01F 35/511* (2022.01); *C23C 16/45536* (2013.01); *C23C 16/45548* (2013.01); *C23C 16/45561* (2013.01); *H01J 37/32357* (2013.01); *H01J 37/3244* (2013.01); *H01L 21/67017* (2013.01)

(58) Field of Classification Search
CPC .... B01F 23/19; B01F 25/102; B01F 25/3141; B01F 25/31423; B01F 25/421; B01F 35/511; H01J 37/32357; H01J 37/3244; H01L 21/67017; H01L 21/67253
See application file for complete search history.

(56) References Cited

U.S. PATENT DOCUMENTS

| | | | |
|---|---|---|---|
| 4,480,925 | A | 11/1984 | Dietrich |
| 4,520,757 | A | 6/1985 | Nath |
| 4,869,284 | A | 9/1989 | Scott et al. |
| 4,909,914 | A | 3/1990 | Chiba et al. |
| 5,284,519 | A | 2/1994 | Gadgil |
| 5,523,063 | A | 6/1996 | Anderson |
| 5,573,334 | A | 11/1996 | Anderson |
| 5,846,330 | A | 12/1998 | Quirk et al. |
| 5,851,294 | A | 12/1998 | Young et al. |
| 5,951,771 | A | 9/1999 | Raney et al. |
| 6,933,010 | B2 | 8/2005 | Yamada et al. |
| 7,017,514 | B1 | 3/2006 | Shepherd, Jr. et al. |
| 7,018,435 | B1 | 3/2006 | Wentinck |
| 9,312,154 | B2 | 4/2016 | Tran et al. |
| 10,008,368 | B2 | 6/2018 | Rozenzon et al. |
| 10,163,606 | B2 | 12/2018 | Rozenzon et al. |
| 10,232,324 | B2 | 3/2019 | Shah et al. |
| 10,774,420 | B2 | 9/2020 | Terada et al. |
| 10,847,337 | B2 | 11/2020 | Shono et al. |
| 11,293,096 | B2 | 4/2022 | Morikawa et al. |
| 11,732,355 | B2 * | 8/2023 | Pandey ............... H01J 37/3244 |
| | | | 118/723 R |
| 2002/0073925 | A1 | 6/2002 | Noble et al. |
| 2002/0131325 | A1 | 9/2002 | Matula |
| 2002/0195055 | A1 | 12/2002 | Grant et al. |
| 2003/0015596 | A1 | 1/2003 | Evans |
| 2003/0019428 | A1 | 1/2003 | Ku et al. |
| 2003/0079686 | A1 | 5/2003 | Chen et al. |
| 2003/0101938 | A1 | 6/2003 | Ronsse et al. |
| 2003/0121608 | A1 | 7/2003 | Chen et al. |
| 2003/0205096 | A1 | 11/2003 | Gehner et al. |
| 2004/0028810 | A1 | 2/2004 | Grant et al. |
| 2004/0077183 | A1 | 4/2004 | Chung |
| 2004/0089235 | A1 | 5/2004 | Yamada et al. |
| 2004/0144311 | A1 | 7/2004 | Chen et al. |
| 2005/0139160 | A1 | 6/2005 | Lei et al. |
| 2005/0221618 | A1 | 10/2005 | Amrhein et al. |
| 2005/0252449 | A1 | 11/2005 | Nguyen et al. |
| 2005/0270895 | A1 | 12/2005 | Strang |
| 2005/0271812 | A1 | 12/2005 | Myo et al. |
| 2005/0271813 | A1 | 12/2005 | Kher et al. |
| 2006/0014399 | A1 | 1/2006 | Joe |
| 2006/0042754 | A1 | 3/2006 | Yoshida et al. |
| 2006/0118240 | A1 | 6/2006 | Holber et al. |
| 2006/0127827 | A1 | 6/2006 | Yoshida et al. |
| 2006/0137608 | A1 | 6/2006 | Choi et al. |
| 2007/0044719 | A1 | 3/2007 | Ku et al. |
| 2007/0272299 | A1 | 11/2007 | Schuss et al. |
| 2008/0041448 | A1 | 2/2008 | Park |
| 2008/0102208 | A1 | 5/2008 | Wu et al. |
| 2008/0107809 | A1 | 5/2008 | Wu et al. |
| 2008/0115801 | A1 | 5/2008 | Chin et al. |
| 2008/0202416 | A1 | 8/2008 | Provencher et al. |
| 2008/0202425 | A1 | 8/2008 | Gelatos et al. |
| 2008/0206987 | A1 | 8/2008 | Gelatos et al. |
| 2008/0230518 | A1 | 9/2008 | Brillhart et al. |
| 2009/0162260 | A1 | 6/2009 | Bera et al. |
| 2010/0003406 | A1 | 1/2010 | Lam et al. |
| 2010/0294199 | A1 | 11/2010 | Tran et al. |
| 2011/0065276 | A1 | 3/2011 | Ganguly et al. |
| 2011/0098841 | A1 | 4/2011 | Tsuda |
| 2011/0203560 | A1 | 8/2011 | Wallace |
| 2011/0223334 | A1 | 9/2011 | Yudovsky et al. |
| 2011/0265715 | A1 | 11/2011 | Keller |
| 2011/0305102 | A1 | 12/2011 | Berger et al. |
| 2012/0227848 | A1 | 9/2012 | Oya et al. |
| 2012/0269968 | A1 | 10/2012 | Rayner, Jr. |
| 2012/0289057 | A1 | 11/2012 | DeDontney |
| 2012/0307588 | A1 | 12/2012 | Hanada et al. |
| 2012/0324789 | A1 | 12/2012 | Pease et al. |
| 2013/0058835 | A1 | 3/2013 | Salazar-Guillen et al. |
| 2013/0082410 | A1 | 4/2013 | Goodwin et al. |
| 2013/0109162 | A1 | 5/2013 | Rogers et al. |
| 2013/0109164 | A1 | 5/2013 | Olsen et al. |
| 2014/0014270 | A1 | 1/2014 | Shah et al. |
| 2014/0058179 | A1 | 2/2014 | Stevens et al. |
| 2014/0227881 | A1 | 8/2014 | Lubomirsky et al. |
| 2015/0170924 | A1 | 6/2015 | Nguyen et al. |
| 2015/0240359 | A1 | 8/2015 | Jdira et al. |
| 2015/0287573 | A1 | 10/2015 | Taskar et al. |
| 2015/0371826 | A1 | 12/2015 | Rozenzon et al. |
| 2015/0376784 | A1 | 12/2015 | Wu et al. |
| 2016/0032456 | A1 | 2/2016 | Wongsenakhum et al. |
| 2016/0097119 | A1 | 4/2016 | Cui et al. |
| 2016/0168705 | A1 | 6/2016 | Lind |
| 2016/0343625 | A1 | 11/2016 | Wu et al. |
| 2016/0362785 | A1 | 12/2016 | Kim et al. |
| 2017/0016236 | A1 | 1/2017 | Moller, Jr. et al. |
| 2017/0021317 | A1 | 1/2017 | Shareef et al. |
| 2017/0121818 | A1 | 5/2017 | Dunn et al. |
| 2017/0200586 | A1 | 7/2017 | Treadwell et al. |
| 2017/0204989 | A1 | 7/2017 | Burkhart et al. |
| 2017/0231078 | A1 | 8/2017 | Gomaa et al. |
| 2017/0350011 | A1 | 12/2017 | Marquardt |
| 2018/0347045 | A1 | 12/2018 | Olsen et al. |
| 2019/0228942 | A1 | 7/2019 | Shono et al. |
| 2019/0295822 | A1 | 9/2019 | Olsen et al. |
| 2020/0115797 | A1 | 4/2020 | Tsuji et al. |
| 2020/0199748 | A1 | 6/2020 | Pandey et al. |
| 2021/0074505 | A1 | 3/2021 | Shono et al. |
| 2023/0407471 | A1 * | 12/2023 | Pandey ............... H01J 37/3244 |

FOREIGN PATENT DOCUMENTS

| | | | |
|---|---|---|---|
| CN | 102414794 | A | 4/2012 |
| CN | 105679633 | A | 6/2016 |
| CN | 107403714 | A | 11/2017 |
| CN | 108400102 | A | 8/2018 |
| CN | 108962714 | A | 12/2018 |
| JP | H02161724 | A | 6/1990 |

(56)  References Cited

FOREIGN PATENT DOCUMENTS

| JP | H04080366 A | 3/1992 |
| JP | H06010138 A | 1/1994 |
| JP | 07211643 | 8/1995 |
| JP | 2002-057114 A | 2/2002 |
| JP | 2003133300 A | 5/2003 |
| JP | 2003239072 A | 8/2003 |
| JP | 2004214622 A | 7/2004 |
| JP | 2004323894 A | 11/2004 |
| JP | 2005033173 A | 2/2005 |
| JP | 2007-073539 A | 3/2007 |
| JP | 2007335755 A | 12/2007 |
| JP | 2009-503905 A | 1/2009 |
| JP | 2009524244 A | 6/2009 |
| JP | 2014527300 A | 10/2014 |
| JP | 2017533599 A | 11/2017 |
| JP | 2018090901 A | 6/2018 |
| KR | 1020000061954 | 10/2000 |
| KR | 20070085588 A | 8/2007 |
| KR | 20170082989 A | 7/2017 |
| TW | 201324591 A | 6/2013 |
| WO | 2007/027350 | 3/2007 |
| WO | 2007075509 A2 | 7/2007 |
| WO | 2010079766 A1 | 7/2010 |

OTHER PUBLICATIONS

Search Report for Chinese Application No. 201980082954.2 dated Jun. 8, 2023.

Office Action for Korean Application No. 10-2021-7022721 dated Mar. 7, 2023.

KR Office Action dated Mar. 7, 2023 for Application No. 10-2021-7022721. (With English Translation).

Office Action for Japanese Application No. 2021-534959 dated Oct. 11, 2022.

Taiwan Office Action and Search Report dated Sep. 22, 2020, for Taiwan Patent Application No. 108141721.

PCT International Search Report and Written Opinion dated Feb. 12, 2020, for International Application No. PCT/US2019/057690.

International Search Report and Written Opinion dated Sep. 27, 2013 for PCT Application No. PCT/US2013/048855.

Office Action from the United States Patent and Trademark Office regarding U.S. Appl. No. 16/662,132 dated Feb. 24, 2022.

Final Office Action from the United States Patent and Trademark Office regarding U.S. Appl. No. 16/662,132 dated Nov. 10, 2022.

Notice of Allowance from the United States Patent and Trademark Office regarding U.S. Appl. No. 16/662,132 dated Mar. 1, 2023.

Korean Office Action dated Apr. 25, 2024 for Application No. 10-2023-7041701.

Office Action for Japanese Application No. 2023-001806 dated Sep. 26, 2023.

Japanese Office Action for Application No. 2024-063643 mailed Aug. 5, 2025.

* cited by examiner

FIG. 1B(1)

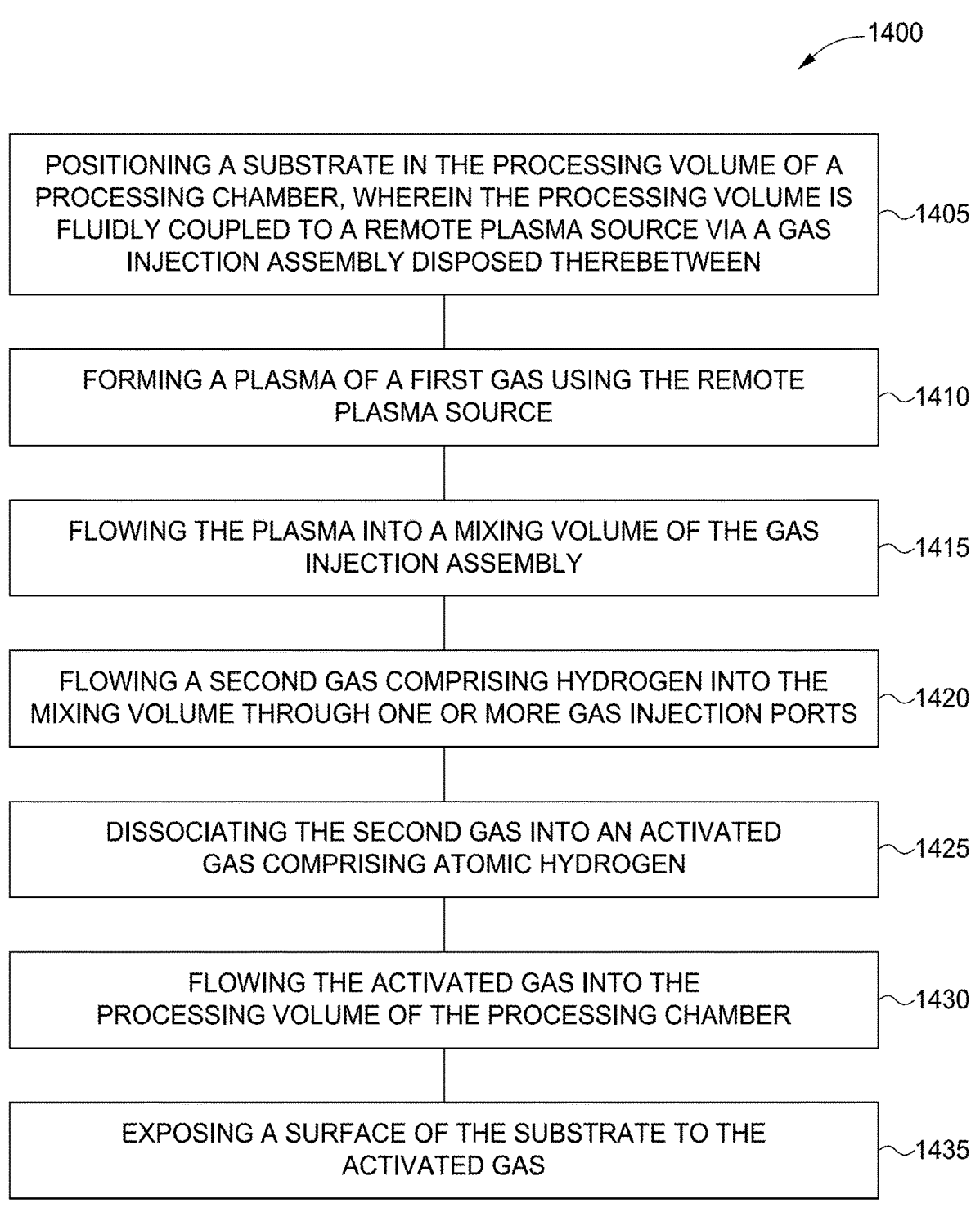

1400

POSITIONING A SUBSTRATE IN THE PROCESSING VOLUME OF A PROCESSING CHAMBER, WHEREIN THE PROCESSING VOLUME IS FLUIDLY COUPLED TO A REMOTE PLASMA SOURCE VIA A GAS INJECTION ASSEMBLY DISPOSED THEREBETWEEN — 1405

FORMING A PLASMA OF A FIRST GAS USING THE REMOTE PLASMA SOURCE — 1410

FLOWING THE PLASMA INTO A MIXING VOLUME OF THE GAS INJECTION ASSEMBLY — 1415

FLOWING A SECOND GAS COMPRISING HYDROGEN INTO THE MIXING VOLUME THROUGH ONE OR MORE GAS INJECTION PORTS — 1420

DISSOCIATING THE SECOND GAS INTO AN ACTIVATED GAS COMPRISING ATOMIC HYDROGEN — 1425

FLOWING THE ACTIVATED GAS INTO THE PROCESSING VOLUME OF THE PROCESSING CHAMBER — 1430

EXPOSING A SURFACE OF THE SUBSTRATE TO THE ACTIVATED GAS — 1435

FIG. 14

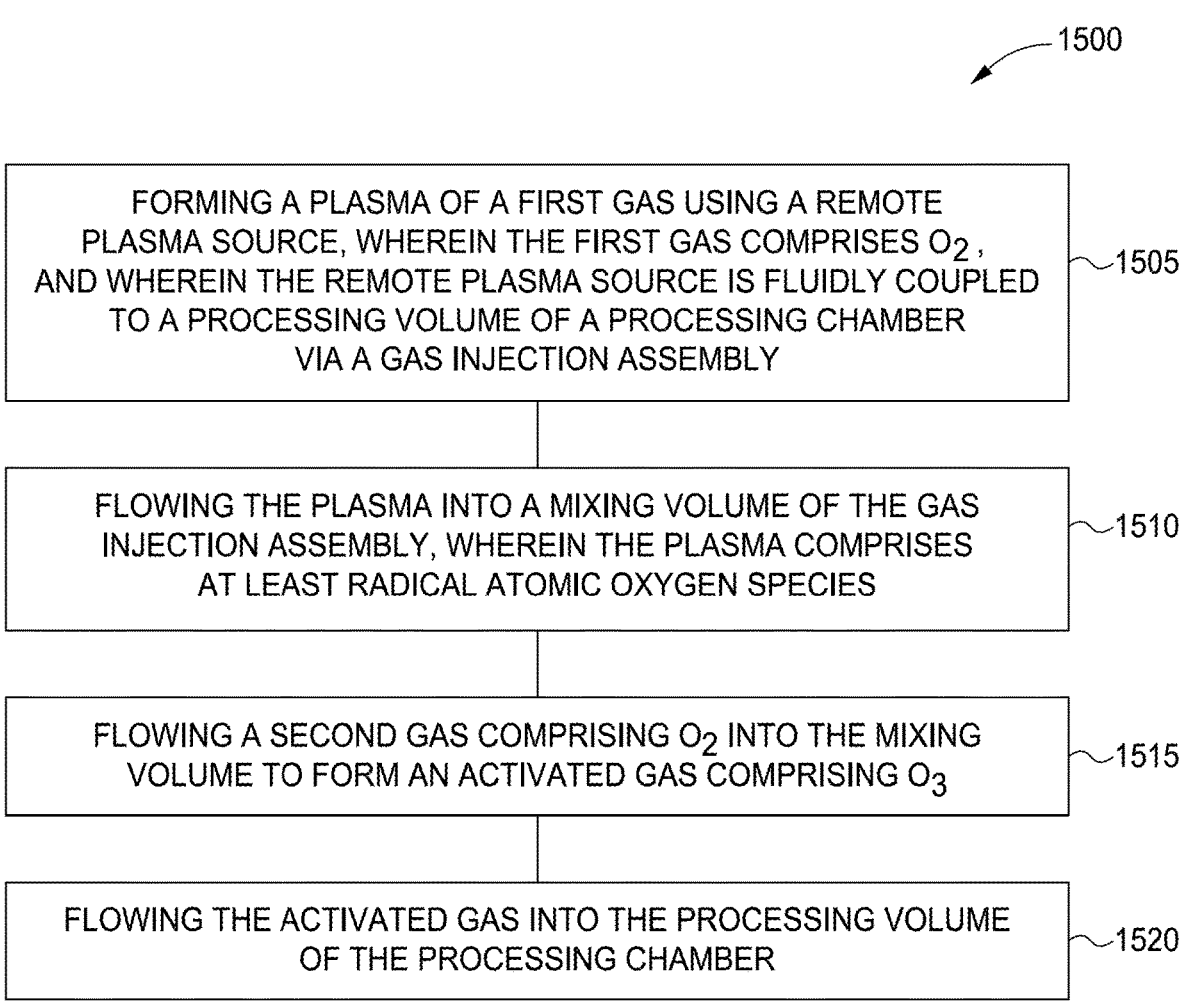

1500

FORMING A PLASMA OF A FIRST GAS USING A REMOTE
PLASMA SOURCE, WHEREIN THE FIRST GAS COMPRISES $O_2$,
AND WHEREIN THE REMOTE PLASMA SOURCE IS FLUIDLY COUPLED
TO A PROCESSING VOLUME OF A PROCESSING CHAMBER
VIA A GAS INJECTION ASSEMBLY

1505

FLOWING THE PLASMA INTO A MIXING VOLUME OF THE GAS
INJECTION ASSEMBLY, WHEREIN THE PLASMA COMPRISES
AT LEAST RADICAL ATOMIC OXYGEN SPECIES

1510

FLOWING A SECOND GAS COMPRISING $O_2$ INTO THE MIXING
VOLUME TO FORM AN ACTIVATED GAS COMPRISING $O_3$

1515

FLOWING THE ACTIVATED GAS INTO THE PROCESSING VOLUME
OF THE PROCESSING CHAMBER

METHOD AND APPARATUS FOR SUPPLYING IMPROVED GAS FLOW TO A PROCESSING VOLUME OF A PROCESSING CHAMBER

CROSS-REFERENCE TO RELATED APPLICATIONS

This application is a continuation of U.S. patent application Ser. No. 16/662,134, filed Oct. 24, 2019, which claims benefit of U.S. Provisional Patent Application No. 62/782,551, filed Dec. 20, 2018, the entirety of which is herein incorporated by reference.

BACKGROUND

Field

Embodiments described herein generally relate to the field of semiconductor device manufacturing processes, and more particularly, to methods of providing radical molecular species and/or radical atomic species to a processing volume of a process chamber during an electronic device fabrication process, and apparatus related thereto.

Description of the Related Art

Remote plasma sources are commonly used to provide activated gases comprising radical and/or ion species to a processing volume of a process chamber, and to a surface of a substrate disposed in the processing volume, during the manufacturing of electronic devices, such as semiconductor devices on the substrate. In one such process, a processing gas is provided to the remote plasma source, a plasma is formed from the processing gas in the remote plasma source, and the plasma is flowed into the processing volume of the process chamber where a surface of a substrate is exposed thereto. In some processes, such as nitridation processes where a film layer on the substrate is modified by the incorporation of nitrogen therein, it may be useful to provide a plasma activated radical molecular species, such as NH and/or, $NH_2$ to the processing volume and the surface of a substrate disposed therein. However, when a molecular gas, for example $NH_3$, is provided to a remote plasma source and a plasma is formed therefrom, the resulting radicals in the plasma largely comprise radical atomic species, for example N and H, as controlling the remote plasma source process to produce radical molecular species, such as NH and/or, $NH_2$ in predetermined quantities can be prohibitively difficult. Further, recombination of the radical atomic species (through gas phase collisions occurring in a delivery line between the remote plasma source and the process chamber or in the process chamber before reaching the substrate) is difficult to control and often produces undesired species, for example unreactive species such as $N_2$, rather than the desired radical molecular species, such as NH and/or, $NH_2$ provided in the example.

In other processes, such as selective oxidation processes or hydrogen passivation processes, it is useful to provide hydrogen radicals, herein atomic hydrogen, to the surface of a substrate. Unfortunately, conventional remote plasma sources are generally incompatible with plasmas formed of high concentrations of hydrogen, such as concentrations more than 20 atomic percent (at %), because higher concentrations of hydrogen ions in the plasma may result in damage to the dielectric surfaces of the remote plasma source. Therefore, atomic hydrogen can be produced using a hot-wire source where molecular hydrogen is thermally dissociated into radical (atomic) species through collision with a hot-wire filament, for example, a tungsten filament. However, hot-wire dissociation of hydrogen can lead to undesirable metal contamination on the surface of the substrate, such as tungsten contamination, from the hot-wire filament.

Accordingly, what is needed in the art are improved methods, and apparatus related thereto, of providing radical molecular species and/or radical atomic species to the processing volume of a process chamber.

SUMMARY

The present disclosure generally provides methods of providing radical molecular species and/or radical atomic species to a processing volume of a process chamber during an electronic device fabrication process, and apparatus related thereto. As used herein, a "gas mixture" is to mean a plurality of different species in a gaseous phase, including radical molecular species and/or radical atomic species.

In an embodiment, a substrate processing system, comprises: a substrate process chamber with a sidewall, a cover, and a base, wherein the sidewall has a gas inlet; a gas inlet conduit coupled to the gas inlet; a mixing plate coupled to the gas inlet conduit with a mixing plate opening in the mixing plate that registers with, and fluidly couples with, the gas inlet conduit, wherein the mixing plate defines a plane and the mixing plate opening is formed perpendicular to the plane and defined by a wall, and wherein at least one gas passage is formed within the mixing plate and fluidly coupled to the gas inlet conduit by a corresponding gas opening formed in the wall; a remote plasma source fluidly coupled to the mixing plate opening by a remote plasma conduit; and a gas source fluidly coupled to the at least one gas passage by a gas source conduit.

In an embodiment, a gas injection assembly comprises: a mixing plate with an outside edge having a plurality of gas inlets formed in the outside edge, a mixing plate opening formed through the mixing plate perpendicular to a major plane defined by the mixing plate, wherein the mixing plate opening is defined by a wall and a plurality of gas openings are formed through the wall; wherein a plurality of gas passages fluidly couples each gas inlet of the plurality of gas inlets to a corresponding gas opening in the wall.

In an another embodiment, a gas injection assembly, comprises: a mixing plate defined by an outside edge, wherein a plurality of gas inlets are formed in the outside edge of the mixing plate, wherein the mixing plate comprises a mixing plate opening formed perpendicularly through a plane defined parallel to the mixing plate, wherein a central axis is parallel to the plane, wherein the mixing plate opening is defined by a wall and a plurality of gas openings are formed through the wall; wherein a plurality of gas passages fluidly couples each gas inlet of the plurality of gas inlets to a corresponding gas opening, and at least one gas passage of the plurality of gas passages is aligned along a radius of the mixing plate opening.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 1B(1) is a schematic cross-sectional view of a nozzle of a gas injection assembly, according to embodiments of the present disclosure.

FIG. 14 is a flow diagram of a method of providing atomic hydrogen to a surface of a substrate disposed in a processing volume of a process chamber, according to embodiments of the disclosure.

FIG. 15 is a flow diagram of a method of providing ozone (O3) to the processing volume of a process chamber, according to embodiments of the disclosure.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1A:
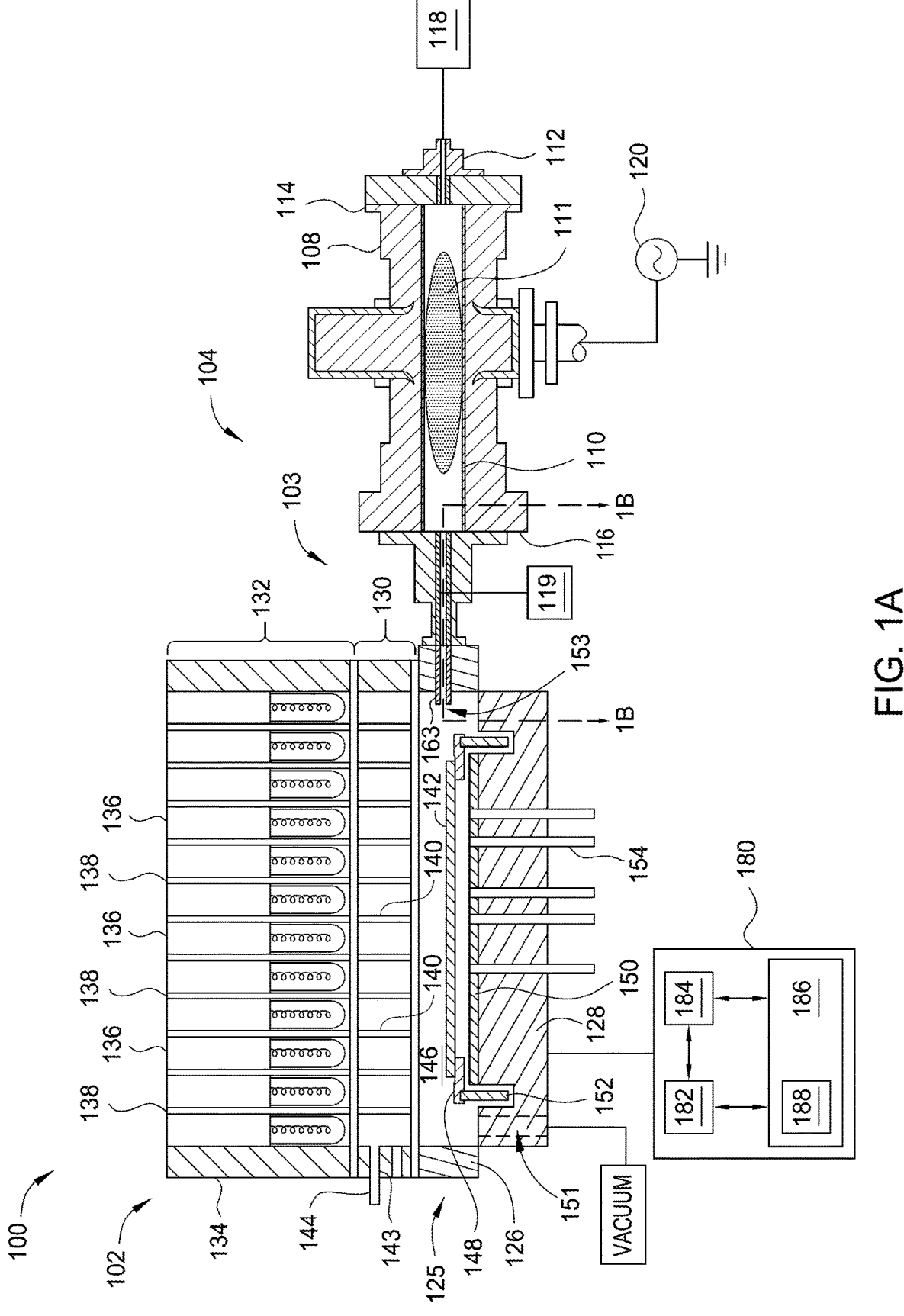
FIG. 1A is a schematic cross-sectional view of a processing system, according to embodiments of the present disclosure.

Embodiments described herein generally relate to the field of semiconductor manufacturing processes, and more particularly, to methods of providing at least metastable radical molecular species and/or radical atomic species to a processing volume of a process chamber during an electronic device fabrication process, and apparatus related thereto. The process chamber can have a liner disposed therein which is fabricated from quartz, sapphire, or combinations thereof. Herein, a metastable radical species is one that maintains radical form before recombination into a non-radical species, under the processing conditions of the processing system, for more than about 10 milliseconds, such as more than about 0.1 seconds, or between about 10 milliseconds and about 3 seconds, for example between about 0.1 seconds and about 3 seconds.

Embodiments discussed herein are further directed towards introducing two or more flow streams by introducing a gas such as $H_2$ from a gas source coupled to a process chamber while bypassing a radical plasma source (RPS) that provides radicals to the chamber. The RPS is bypassed via an inlet coupled to a mixing plate, the mixing plate disposed in between the RPS and the process chamber at the RPS inlet. The mixing plate is defined by an outside edge and may comprise a geometry of a polygon with sharp or rounded edges, or may be a circular or elliptical geometry.

The mixing plate can be further defined by a plurality of quadrants, each quadrant defined by an intersection of a central (vertical) axis and a horizontal axis in a center of the mixing plate. In some examples, each quadrant is defined by the intersection of the vertical and horizontal axes as well as by one or more outer edges of the mixing plate. Two adjacent quadrants thus form a half of the plate, which may be an upper half, lower half, right half, or left half. The mixing plate comprises at least one inlet formed in the outside edge(s) and an opening formed through the mixing plate. The opening can be formed in the center of the mixing plate, or can be offset from a central axis of the mixing plate. The opening is defined by an outer wall that may be as thick as, thicker than, or thinner than a thickness of the mixing plate, and at least one outlet is defined in the wall. The at least one inlet and the at least one outlet are fluidly connected by a plurality of gas passages ("passages"), and, in some examples, the mixing plate has a plurality of inlets and a plurality of outlets designed to provide gas to a chamber via the opening.

The separate gas source introduces Ar, $N_2$, He, $H_2$, $NH_3$, $N_2O$, $H_2O$ vapor, $H_2O_2$ vapor, or combinations thereof, to the mixing plate through a separate inlet formed in an edge of the mixing plate, and the mixing plate acts as a conduit for the $H_2$ to mix with the feed from the RPS source in the inlet, prior to entering the chamber via a plasma conduit disposed between the RPS source and the chamber. The mixing plate may comprise a labyrinth structure of at least one passage connected to an inlet from the gas source and to an outlet formed in an opening in the mixing plate that leads into the RPS conduit and into the process chamber. Some mixing plates may comprise one or more inlets coming from the gas ($H_2$) source.

In various embodiments, each mixing plate passage is fluidly connected to another passage, such that two or more passages connect the gas inlet(s) from the gas source to the RPS conduit via a plurality of outlets formed in the opening of the mixing plate. The inlets, outlets, and passages therebetween may be arranged in various configurations of diameters, lengths, angles relative to the $H_2$ source, each other, and/or to a coordinate system of the mixing plate. In some examples, inlets, outlets, and passages may be co-located on an axis such that the inlets, outlets, and passages are aligned along a common axis of the mixing plate. In alternate embodiments, inlets, outlets, and passages may be offset from a common axis by varying distances.

FIG. 1A is a schematic cross-sectional view of a processing system, according to one embodiment. The processing system 100 includes a process chamber 102, a remote plasma source (RPS) 104, and a gas injection assembly 103 coupling the RPS 104 to the process chamber 102. Herein, the process chamber 102 is a rapid thermal processing (RTP) chamber, such as a rapid thermal anneal (RTA) chamber. In other embodiments, the process chamber 102 is any other process chamber where delivery of at least metastable radical molecular species and/or radical atomic species to a processing volume is desired. For example, in other embodiments the process chamber is plasma enhanced or plasma assisted deposition chamber, such as a plasma-enhanced chemical vapor deposition (PECVD) chamber or a plasma-enhanced atomic layer deposition chamber (PEALD).

A controller 180 coupled to the processing system 100 is used to control the operation of the process chamber 102, the RPS 104, and the gas flow into the gas injection assembly 103 disposed therebetween. The gas injection assembly 103 is shown in various configurations herein which include a mixing plate 103A, shown and discussed in at least FIGS. 4-13 below. The controller 180 generally includes a central processing unit (CPU) 182, a memory 186, and support circuits 184 for the CPU 182. The controller 180 may control the processing system 100 directly, or via other computers and/or controllers (not shown) coupled to the process chamber 102, the RPS 104, and/or the gas injection assembly 103 such that a rate of gas flow from the RPS 104 and/or a second gas source 119 is controlled as the gas flow from the RPS 104 and/or a second gas source 119 enters both the gas injection assembly 103 and the process chamber 102.

The controller 180 described herein is any form of a general-purpose computer processor that is used in an industrial setting for controlling various chambers and sub-processors thereon or therein. The memory 186, or computer-readable medium, is one or more of readily available memory such as random access memory (RAM), read only memory (ROM), floppy disk, hard disk, flash drive, or any other form of digital storage, local or remote. The support circuits 184 are coupled to the CPU 182 for supporting the processor in a conventional manner. The support circuits 184 include cache, power supplies, clock circuits, input/output circuitry and subsystems, and the like. In one example, substrate processing parameters are stored in the memory 186 as a software routine 188 that is executed or invoked to turn the controller 180 into a specific purpose controller to control the operations of the processing system 100. The controller 180 is configured to perform any of the methods described herein.

The process chamber 102 includes a chamber base 125, a lamp assembly 132, and a window assembly 130 coupled to the lamp assembly 132. The chamber base 125 includes a base wall 128 and one or more first sidewalls 126. The base wall 128, the one or more first sidewalls 126, and the window assembly 130 define a processing volume 146. The window assembly 130 is disposed between the processing volume 146 and the lamp assembly 132. Herein, the lamp assembly 132, enclosed by one or more second sidewalls 134, includes a plurality of lamps 136 each disposed in a respective tube 138. The window assembly 130 includes a plurality of light pipes 140, where each of the plurality of light pipes 140 is aligned with a respective tube 138 of the lamp assembly 132 so that the radiant thermal energy provided by the plurality of lamps 136 is directed to a substrate 142 disposed in the processing volume 146.

In some embodiments, one or more respective volumes in the plurality of light pipes 140 are maintained at sub-atmospheric conditions using one or more vacuum exhaust pumps (not shown) in fluid communication therewith through an opening 144 formed in one of the one or more second sidewalls 134. In some embodiments, the window assembly 130 further includes a conduit 143 disposed therein for circulating a cooling fluid from a cooling fluid source (not shown) between the plurality of light pipes 140. Herein, the processing volume 146 is fluidly coupled (connected) to a chamber exhaust, such as to one or more dedicated vacuum pumps, through one or more exhaust ports 151. The chamber exhaust maintains the processing volume 146 at sub-atmospheric conditions and evacuates processing and other gases therefrom.

A support ring 148 disposed in the processing volume 146 is used to support a substrate 142 during the processing thereof. The support ring 148 is coupled to a rotatable cylinder 152 which is used to rotate the support ring 148 about a vertical axis thereof to facilitate uniform heating of the substrate 142. In some embodiments, the rotatable cylinder 152 is levitated and rotated by a magnetic levitation system (not shown). A reflector plate 150 disposed on the base wall 128 in the processing volume 146 is used to reflect energy to a non-device surface of the substrate 142 to further facilitate uniform heating of the substrate 142. One or more temperature sensors, such as pyrometers 154 disposed through the base wall 128 and further disposed through the reflector plate 150, are used to monitor the temperature of the substrate 142 during the processing thereof. An activated gas, formed according to embodiments described herein, flows into the processing volume 146 of the process chamber 102 through an inlet port 153, disposed through one of the one or more first sidewalls 126, which is fluidly coupled to the gas injection assembly 103. In some embodiments, the inlet port 153 is defined by a nozzle, such as nozzle 163. Herein, the activated gas comprises molecular and/or atomic species, at least metastable radical molecular and/or radical atomic species, or combinations thereof.

The RPS 104 herein is coupled to a microwave power supply 120 which is used to ignite and maintain a plasma 111 therein. In other embodiments, the RPS 104 comprises an inductively coupled plasma (ICP) source, a transformer coupled plasma (TCP source), or a capacitively coupled plasma (CCP source). In some other embodiments, the RPS is coupled to an RF power supply. The RPS 104 includes an RPS body 108 disposed about a tube 110 in which the plasma 111 is formed. The tube 110 is formed of a dielectric material, such as $SiO_2$, $Al_2O_3$, quartz, or combinations thereof. The RPS body 108 includes a first end 114 coupled to an inlet 112 which is in fluid communication with one or more first gas sources 118 and a second end 116, distal from the first end 114, coupled to the gas injection assembly 103. An example gas injection assembly 103 is further described in FIG. 1B.

Figures 1B, 1C:
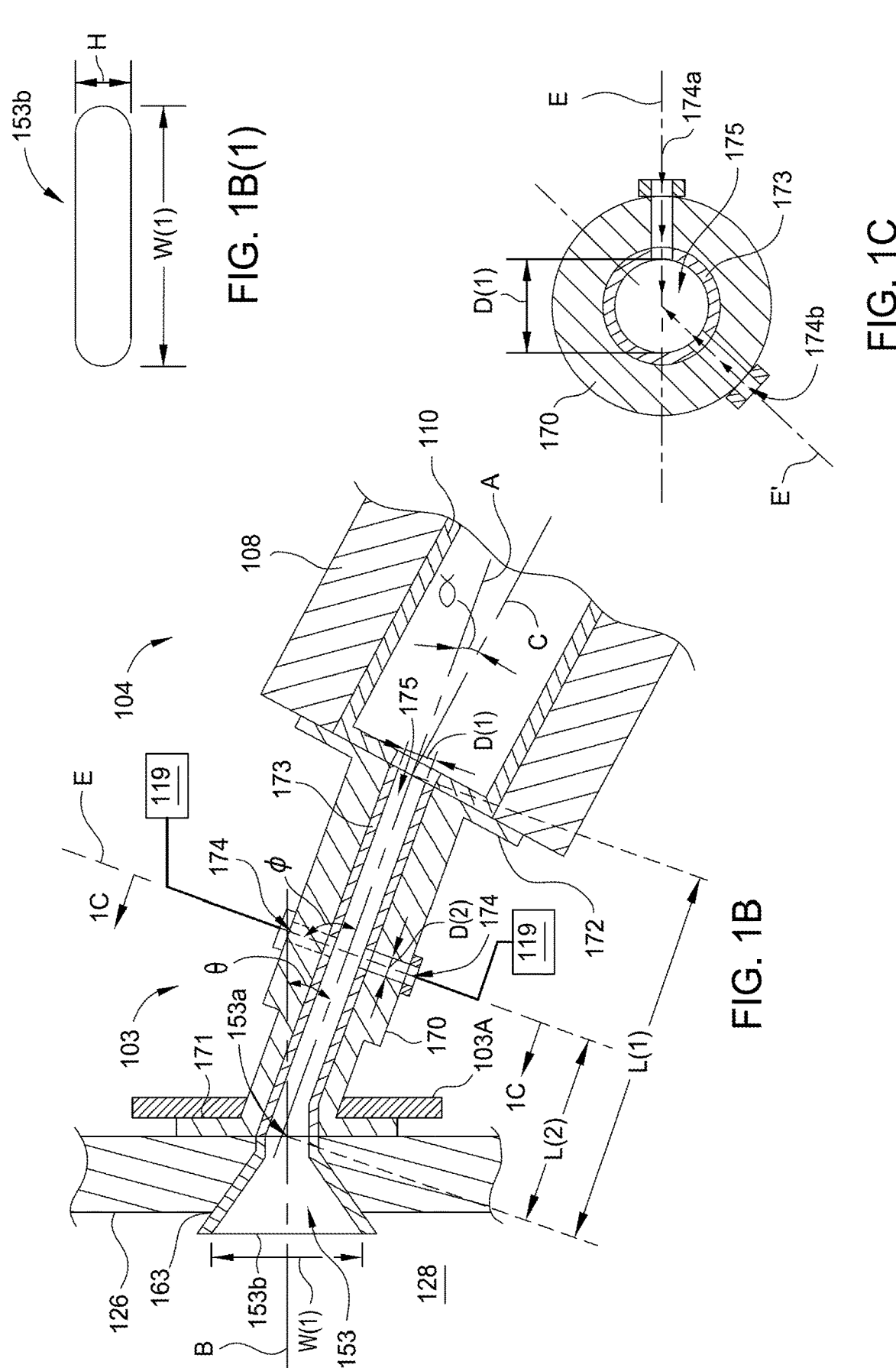
FIG. 1B is a schematic cross-sectional view of the gas injection assembly shown in FIG. 1A taken along line 1B-1B, according to embodiments of the present disclosure.
FIG. 1C is a schematic cross-sectional view of the gas injection assembly of FIG. 1B taken along line 1C-1C, according to embodiments of the present disclosure.

FIG. 1B is a schematic sectional view of a portion of the gas injection assembly 103 taken along line 1B-1B of FIG. 1A. Herein, the gas injection assembly 103 includes a body 170 formed of a metal, such as stainless steel, a low recombination dielectric liner 173, such as quartz or sapphire, and a first flange 171 to couple the gas injection assembly 103 to one of the one or more sidewalls of a process chamber. The gas injection assembly 103 can be coupled to a sidewall such as the one of the one or more first sidewalls 126 of the process chamber 102 described in FIG. 1A. The gas injection assembly further includes a second flange 172 to couple the gas injection assembly 103 to an RPS, such as the RPS 104 described in FIG. 1A, and one or more gas injection ports 174 formed through the body 170 and the liner 173. In some embodiments, the gas injection assembly 103 has a length L(1), measured along its longitudinal axis A between a mounting surface plane of the first flange 171 and a mounting surface plane of the second flange 172, where the length L(1) is between about 25 mm and about 150 mm, such as between about 50 mm and about 100 mm, such as between about 75 mm and about 100 mm.

In some embodiments, the liner 173, coaxially disposed in the body 170 about the longitudinal axis A and protecting the metal body thereof from the activated species in the plasma, defines a mixing volume 175 having a diameter D(1) of between about 20 mm and about 60 mm, such as between about 25 mm and about 50 mm. Herein, the nozzle 163, defining the inlet port 153, includes a first opening 153a proximate to, and in fluid communication with, the mixing volume 175, and a second opening 153b distal from the first opening 153a, where the second opening 153b is disposed in, and in fluid communication with, the processing volume 146 of the process chamber 102. The first opening 153a of the nozzle 163 has a generally circular cross-sectional shape (orthogonal to the longitudinal axis B) and the second opening 153b of the nozzle 163 has a generally oval or rectangular shape, such as the slit shape shown in FIG. 1B(1) having a width W(1) and a height H. Herein, a ratio of the flow cross-sectional area of the mixing volume 175 (where the flow cross-sectional area of the mixing volume 175 is orthogonal to the longitudinal axis A) and the flow cross-sectional area of the inlet port 153 at the second opening 153b (which is orthogonal to longitudinal axis B) is between about 1:5 and about 1:10. Expanding the flow cross-sectional area for gases flowing into the processing volume 146 reduces recombination of radical molecular and/or radical atomic species, resulting in a higher radical concentration and flux at the surface of the substrate when compared to nozzles that do not expand the flow cross-sectional area between the mixing volume 175 and the processing volume 146.

In an example process, a plasma 111 formed in the RPS 104 flows into the mixing volume 175 of the gas injection assembly 103 where radicals and/or ions, for example argon ions, from the plasma collide with the molecular species of one or more second gases, for example $H_2$, injected into the mixing volume 175 through the gas injection ports 174. The radicals and/or ions provided by the plasma 111 have sufficient energy to dissociate the molecular species, through collision therewith, into an activated gas comprising at least metastable radical molecular species and/or radical atomic species, for example atomic hydrogen. Herein, the one or more second gases are provided to the mixing volume 175 through one or more gas injection ports 174, where the one or more gas injection ports 174 are fluidly coupled to the second gas source 119.

Each of the one or more gas injection ports 174 comprise an opening formed through the body 170 and further through the liner 173. In some embodiments, a diameter D(2) of the one or more gas injection ports 174 is between about 0.5 mm and about 6 mm, such as between about 1 mm and about 6 mm, such as between about 2 mm and about 5 mm, for example between about 2 mm and about 4 mm. In some examples, the one or more gas injection ports 174 are located at a distance L(2), as measured along the longitudinal axis A from a mounting surface plane of the first flange 171 to one or more longitudinal axis E of the one or more respective gas injection ports 174. The mixing plate 103A can be coupled to the first flange 171 or used instead of the first flange 171. In some embodiments, the distance L(2) is between about 20 mm and about 80 mm, such as between about 30 mm and about 60 mm, or less than about 80 mm, such as less than about 60 mm. A longitudinal axis E of the one or more gas injection ports forms an angle φ with the longitudinal axis A of the gas injection ports where the angle φ is substantially 90°. In other embodiments, the angle φ is less than about 90° so that the second gas as introduced through the gas injection port 174 is generally flowing in the downstream direction towards the inlet port 153 of the process chamber 102 and not upstream towards the RPS 104.

In one example, a longitudinal axis A of the gas injection assembly 103 intersects with a longitudinal axis B of the inlet port 153 (disposed through one of the one or more sidewalls 126 of a process chamber 102) at an angle θ of between about 0° (i.e., co-linear) and about 80°, such as between about 10° and about 70°, such as between about 20° and about 70°, or between about 10° and about 45°, for example between about 20° and about 45°. In some embodiments, the longitudinal axis A of the gas injection assembly 103 and a longitudinal axis C of the RPS 104 form an angle α of less than about 45°, such as less than about 30°, such as less than about 20°, for example less than about 10°, or between about 0° and or about 20°, for example between about 10° and about 20°. In some embodiments, the longitudinal axis C of the RPS 104 and the longitudinal axis A of the gas injection assembly 103 are substantially co-linear or are substantially parallel. Providing an angle θ, and/or an angle α of more than about 0° promotes recombination of ions with electrons or other charged particles through collision therebetween as the ions lose momentum through collisions when hitting the interior surfaces of the inlet port 153. This substantially reduces the ion density of the activated gas as activated gas flows into the processing volume. Because of the high chemical activity of ions compared to radicals, low ion density in the activated gas provided to the processing volume of a process chamber is useful in some processes, such as the selective oxidation process set forth in FIG. 13.

FIG. 1C is a schematic cross-sectional view of the gas injection assembly 103 taken along lines 1C-1C of FIG. 1B, where the gas injection assembly comprises a plurality of, here two, gas injection ports 174a and 174b. Herein, a longitudinal axis E of a first gas injection port 174a is offset from a second longitudinal axis E' of a second gas injection port 174b so that gases flowing from each of the gas injection ports 174a and 174b are not introduced into the mixing volume 175 directly opposite of one another (not collinear) so that gases introduced therefrom do not undesirably collide head on in the mixing volume 175 which could create an undesirable hot spot and result in less efficient mixing with the plasma flowing therethrough. As shown, the gas injection ports 174a, 174b have a substantially circular cross-sectional shape.

Figure 2:
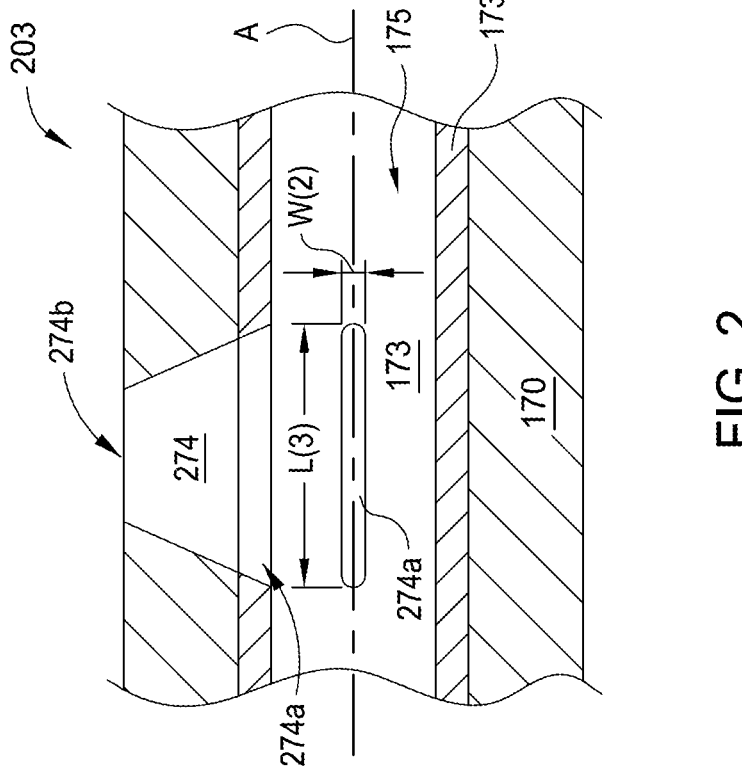
FIG. 2 is a schematic cross-sectional view of a portion of a gas injection assembly, according to embodiments of the present disclosure.

FIG. 2 is a schematic cross-sectional view of a portion of a gas injection assembly 203, according to another embodiment. The gas injection assembly 203 is substantially similar to the gas injection assembly 103 described in FIGS. 1A-1C except that one or more gas injection ports 274 disposed through the body 170 and the liner 173 have a substantially slit cross-sectional shape at a first opening 274a in the liner 173 and a substantially circular cross-sectional shape at a second opening 274b in a surface of the body 170. Herein, the one or more first openings 274a have a length L(3) to width W(2) ratio, of more than 1:1, such as more than 2:1, for example more than about 3:1. In some embodiments, the width W(2) is between about 0.5 mm and about 6 mm, such as between about 1 mm and about 5 mm, for example between about 1 mm and about 4 mm. In this embodiment, the one or more first openings 274a of the one or more gas injection ports 274 are substantially parallel, along a length L(3), to the longitudinal axis A of the gas injection assembly 203. In other embodiments, the one or more first openings 274a of the one or more gas injection ports 274 are substantially orthogonal to the longitudinal axis A along a length L(3). In other embodiments, the first openings 274a of the one or more gas injection ports 274 are of any other orientation to the longitudinal axis A. The cross-sectional shape of the gas injection port 274 gradually changes from a substantially circular cross-sectional shape (orthogonal to the longitudinal axis E) at the second opening 274b to the substantially slit cross-sectional shape at the first opening 274a to direct gas flow therethrough to ribbon like flow as in enters the mixing volume 175. In other embodiments, the one or more gas injection ports 274 maintain a substantially slit cross-sectional shape from the second opening 274b to the first opening 274a and substantially the same cross-sectional opening area therethrough.

Figure 3:
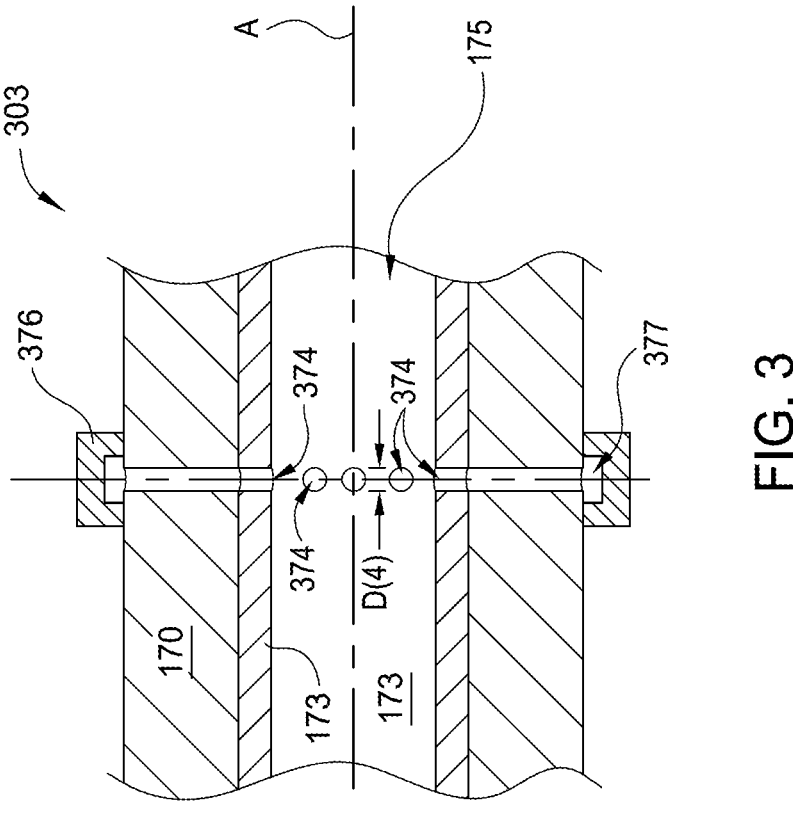
FIG. 3 is a schematic cross-sectional view of a portion of a gas injection assembly, according to embodiments of the present disclosure.

FIG. 3 is a schematic cross-sectional view of a portion of a gas injection assembly 303, according to another embodiment. The gas injection assembly 303 is substantially similar to the gas injection assembly 103 described in FIGS. 1A-1C except that processing gases are delivered to the mixing volume 175 through a plurality of openings 374 formed through the liner 173 and the body 170, where the plurality of openings 374 are in fluid communication with an annular passage 377 disposed in an annular ring 376 coupled to the body 170 and concentrically disposed about a circumference thereof. In some embodiments, each of the plurality of openings 374 have a diameter D(4) between about 0.1 mm and about 5 mm, such as between about 0.5 mm and about 4 mm, or between about 0.5 mm and about 4 mm, for example between about 1 mm and about 4 mm.

Figure 4:
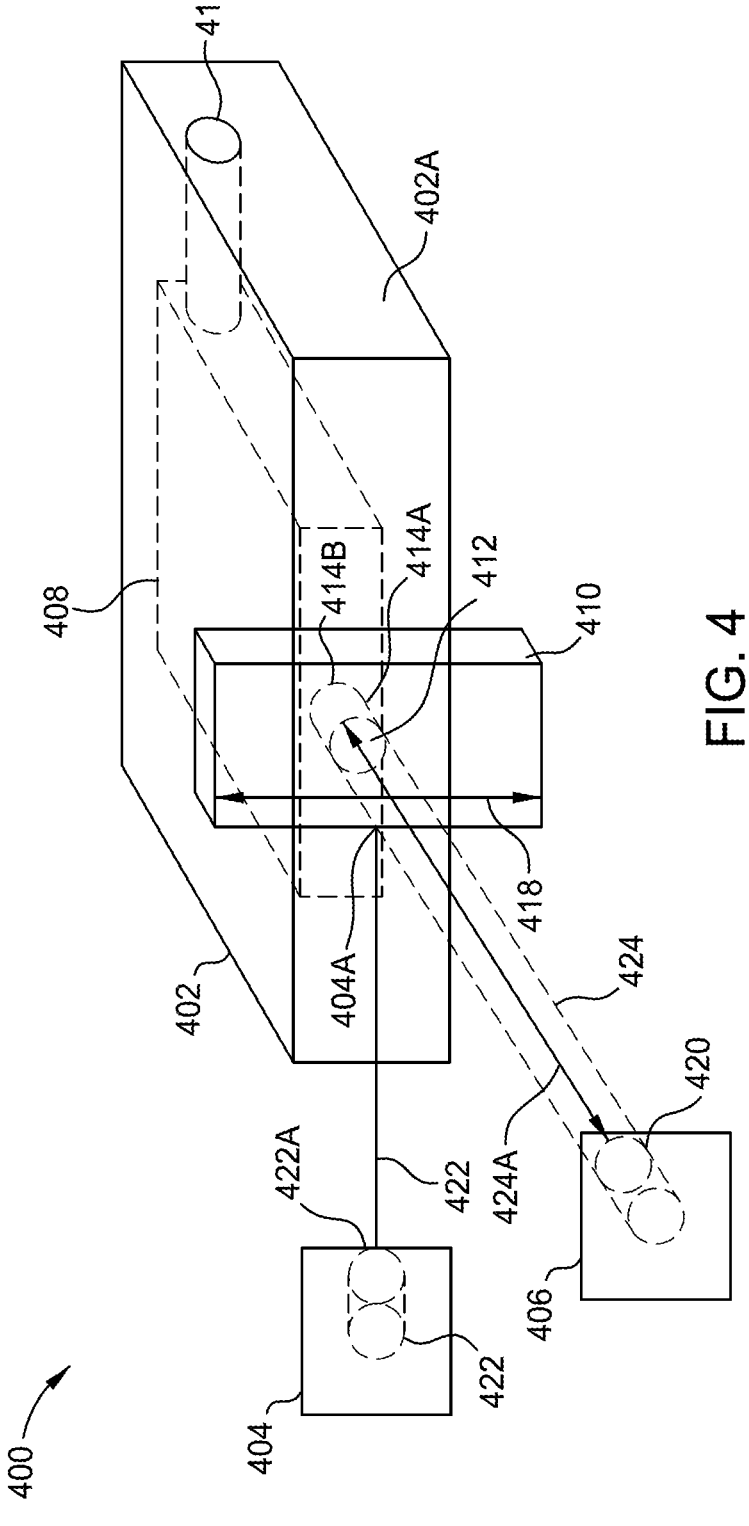
FIG. 4 is a schematic perspective view of an embodiment of a gas injection assembly that may be used in conjunction with or instead of the gas injection assembly in FIG. 1.

FIG. 4 is a schematic perspective view of an embodiment of a gas injection assembly that may be used in conjunction with or in place of the gas injection assembly 103 of the processing system 100 discussed above. FIG. 4 shows a substrate processing system 400 comprising a chamber body 402 that is fluidly coupled (connected) to a remote plasma system (RPS) 406 and a second gas source 404. The chamber body 402 is defined by an outside edge 402A and comprises an internal volume 408 that is internal to the structure of the chamber body 402 and may be accessed by a lid (not shown). A main gas inlet conduit 414A coupled to a gas inlet 414B and a gas outlet 416 are also illustrated. A mixing plate 410 is removably coupled to the main gas inlet 414 via an opening 412 of the mixing plate. The mixing plate 410 defines a plane 418 that is perpendicular to a direction of plasma flow from the RPS 406. The RPS 406 delivers plasma to the internal volume 408 via the main gas inlet conduit 414A and a gas inlet 414B of the internal volume 408 via a plasma conduit 424.

The second gas source 404 is fluidly coupled to the internal volume 408 via a carrier conduit 422. The carrier conduit 422 extends from an outlet 422A of the second gas source 404 to at least one inlet 404A of the mixing plate 410. A gas or gas mixture from the second gas source 404 passes through a plurality of passages of the mixing plate 410 via the carrier conduit 422. The carrier gas exits the mixing plate 410 via a plurality of outlets and is introduced into a downstream end of the plasma conduit 424 within the mixing plate 410 adjacent a gas inlet conduit 414A, or alternatively, is introduced into the gas inlet conduit 414A. The plasma conduit 424 extends between a remote plasma source outlet 420 and the main gas inlet conduit 414A. The plasma conduit 424 has a length 424A measured from the at least one inlet 404A of the mixing plate 410 to the remote plasma source outlet 420. The carrier gas mixes with the plasma from the RPS 406 in the plasma conduit 424.

In the example in FIG. 4, the mixing plate 410 is disposed at a first end of the plasma conduit 424 that is adjacent to the main gas inlet conduit 414A. While the drawings are not to scale, in the example in FIG. 4, the mixing plate 410 is disposed along the plasma conduit 424 in a position that is 95% to 100% of the length 424A of the plasma conduit 424. However, it is contemplated that, in other examples, that the mixing plate 410 may be positioned in other locations along the plasma conduit 424. In one example, the mixing plate 410 can be positioned along the plasma conduit 424 in a location that is about 10% of the length 424A of the plasma conduit. In another example, the mixing plate 410 can be positioned along the plasma conduit 424 in a location that is about 15% to 94% of the length 424A of the plasma conduit 424.

The position of the mixing plate 410 along the plasma conduit 424 can be selected to preserve the radicals from the RPS 406 by placing the mixing plate closer to the chamber body 402 than the RPS 406. In other examples, the position of the mixing plate 410 can be selected to be closer to the RPS 406 than the internal volume 408. A position closer to the RPS 406 than to the internal volume 408 can reduce the occurrence of re-combinations of radicals in the plasma conduit 424. The position of the mixing plate 410 can depend on factors including the diameter of the plasma conduit 424, the length 424A of the plasma conduit 424, the passage configuration of the mixing plate 410, the flow rate of the carrier gas, and/or the flow rate of the plasma.

The mixing plate 410 can be designed in various configurations. In one example, the mixing plate 410 can be designed to have a target velocity ratio between the velocity of the carrier gas in each passage and the velocity of the plasma in the plasma conduit 424. The velocity ratio ($V_c$: $V_{RPS}$) is a ratio of the velocity of each passage carrying the carrier gas ($V_c$) to the velocity of the plasma ($V_{RPS}$) in the plasma conduit 424. The velocity ratio can be from about 10:1 to about 10:9 for each passage of the mixing plate 410 that is coupled to an outlet of the mixing plate that leads to the plasma conduit 424. In one example, each passage of the mixing plate 410 that is coupled to the outlet (discussed in detail below) can have the same velocity ($V_{cx}$, where "x" is an identifier of the passage in the mixing plate). In another example, two or more passages of the mixing plate 410 or can have different velocities. The velocity of a carrier gas through a passage of the mixing plate 410 can depend upon factors including the configuration of each passage such as diameter and/or tapering. In addition, the dimensions of passages coupled to a passage of the mixing plate 410 can impact the velocity of carrier gas through a passage that is coupled to the outlet. The flow rate of carrier gas ($F_c$) in each passage coupled to an outlet of the mixing plate 410 can be from about 1 slm to about 50 slm. The flow rate of the plasma ($F_{RPS}$) from the RPS 406 can be from 1 slm to about 20 slm. In other examples, a flow rate ratio ($F_c$:$F_{RPS}$) of the flow rate of the carrier gas ($F_c$) and the flow rate of the plasma ($F_{RPS}$) can be from about 10:1-1:20.

Figure 5A:
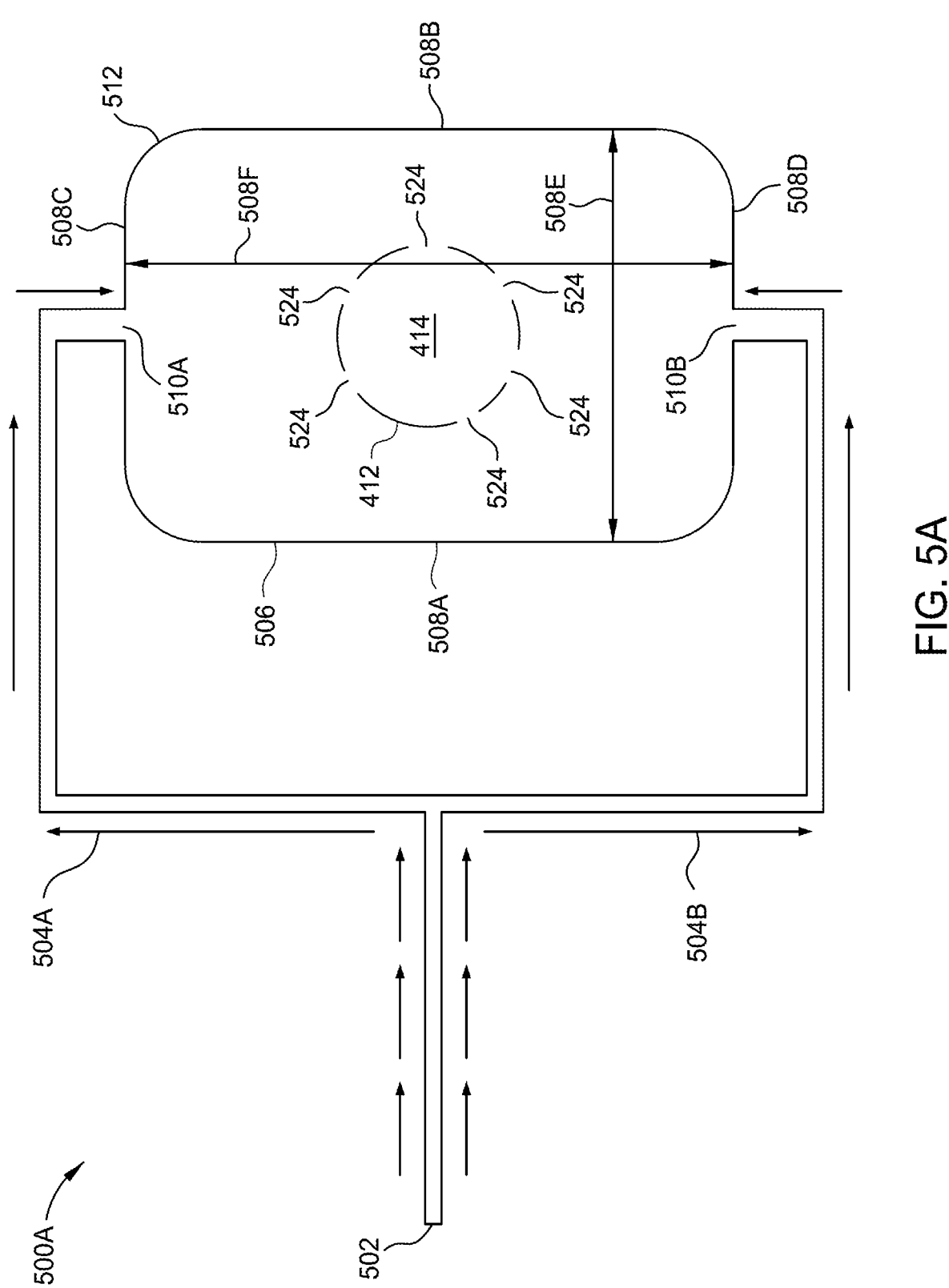
FIGS. 5A-5C are schematic illustrations of mixing plates, according to embodiments of the present disclosure.
Figure 5B:
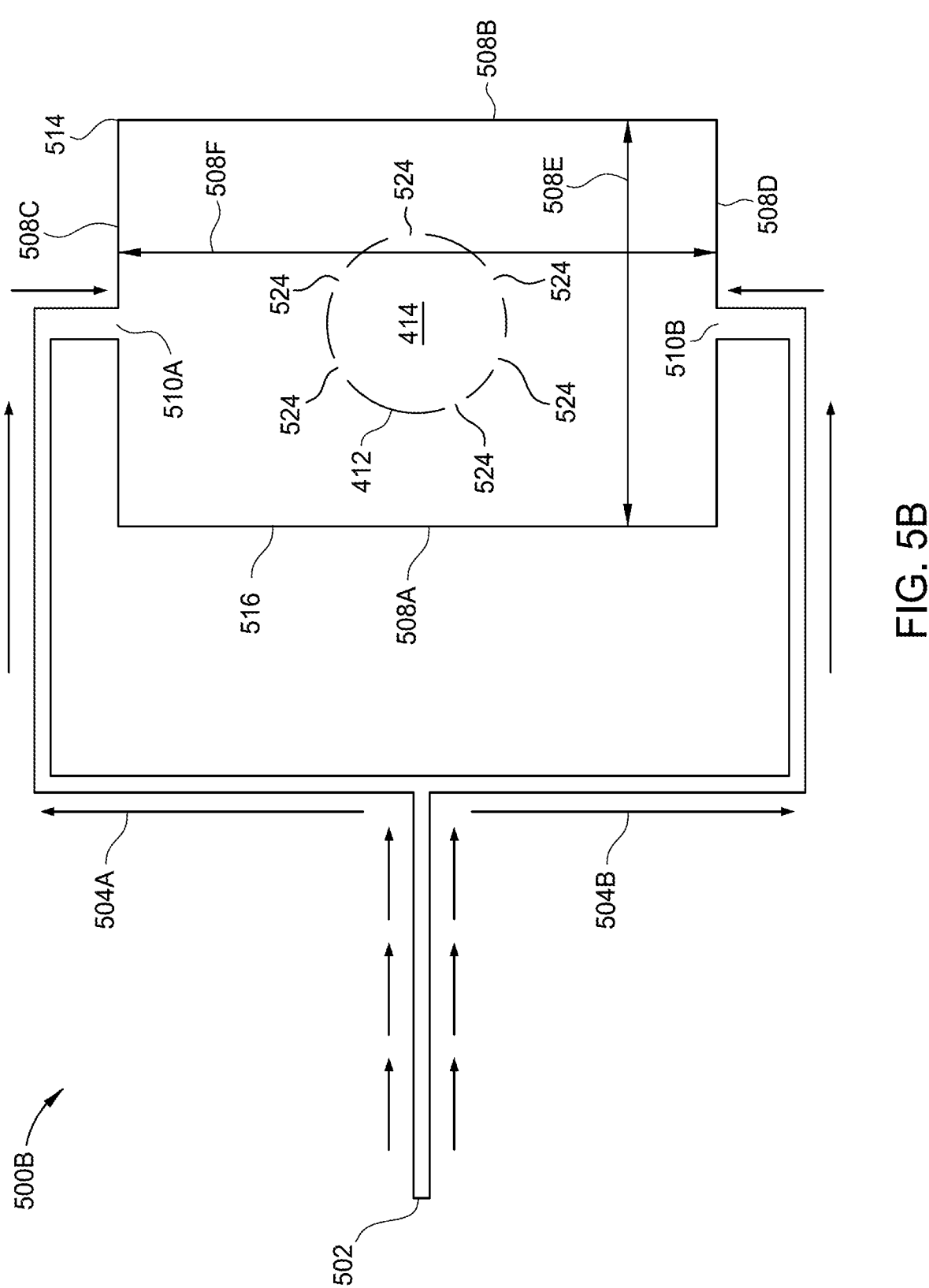
Figure 5C:
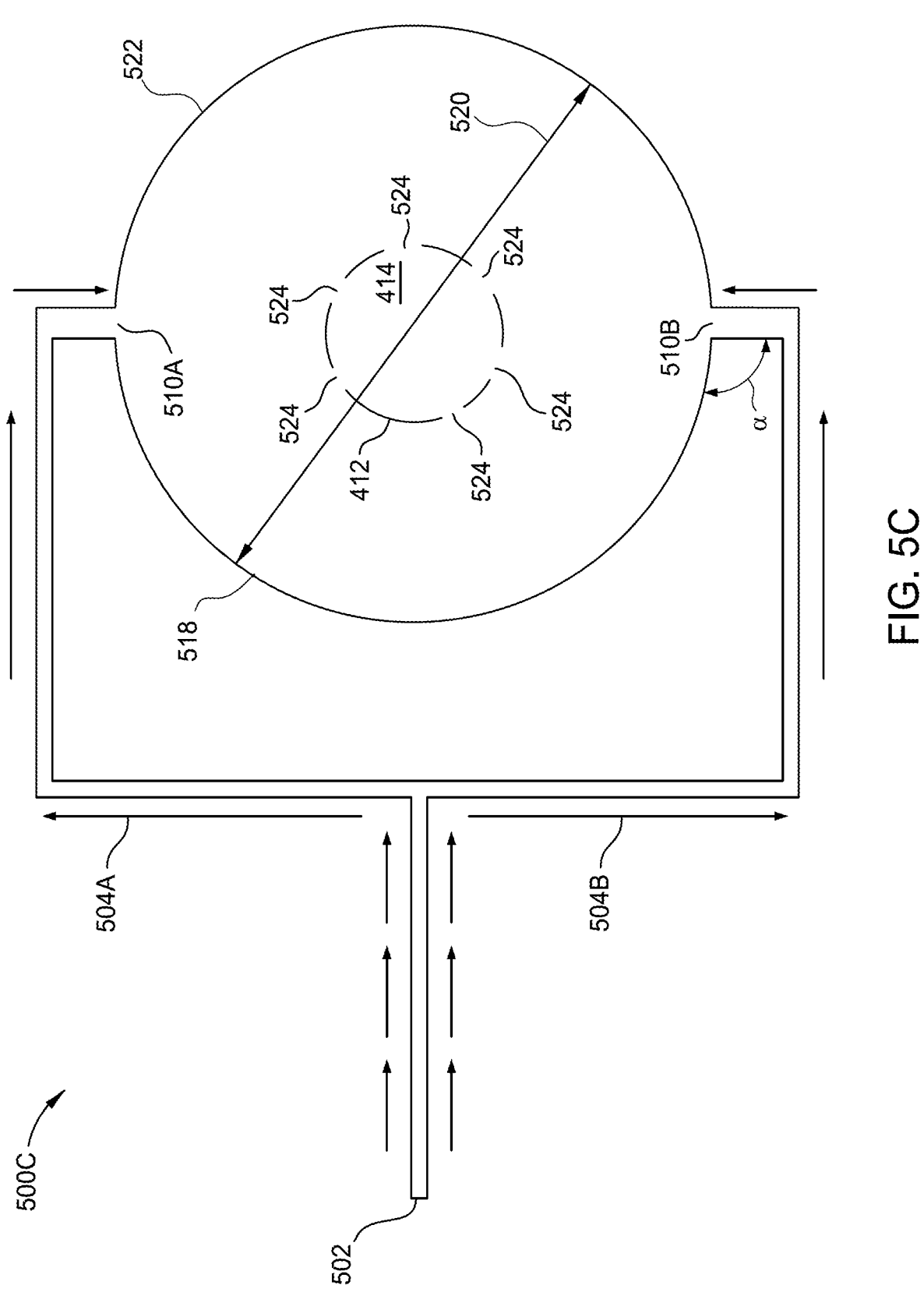

FIGS. 5A-5C are schematic illustrations of mixing plates according to embodiments of the present disclosure. FIGS. 5A-5C illustrate various geometries of mixing plates that can be employed in the systems discussed herein. The plurality of passages that form gas paths from the inlets discussed are not shown here but are shown in FIGS. 6-11 below. FIG. 5A shows a mixing plate assembly 500A, including a gas mixture inlet 502 from a separate gas source such as 119 discussed in FIG. 1. The gas mixture inlet 502 branches out into a first gas passage 504A and a second gas passage 504B, shown here as including right angles that direct gas from the gas mixture inlet 502 into a mixing plate 506 via a first inlet 510A and a second inlet 510B. The mixing plate 506 is defined by four outside edges 508A, 508B, 508C, 508D, as well as a width 508E and a height 508F. The first inlet 510A is fluidly coupled to the first gas passage 504A and the second inlet 510B is fluidly coupled to the second gas passage 504B. The main gas inlet 414 is shown as well, as is the opening 412 that connects a plurality of outlets 524 of the mixing plate 506 to the main gas inlet 414 of a process chamber as discussed in FIG. 4. In an embodiment, the outlets 524 can be spaced at regular intervals around the opening 412. In another embodiment, the outlets 524 can be spaced at irregular intervals (different distances) around the opening 412. In some examples (not shown) only one outlet 524 is formed in the opening 412. The mixing plate 506 is shown as being a polygon with rounded corners 512, where the width 508E is less than the height 508F, but may take other shapes such as a rectangle with a varying aspect ratio, a square, a triangle, hexagon, octagon, or other shapes. The mixing plate 506 comprises a plurality of passages that fluidly connect the inlets 510A and 510B to the outlets of the opening 412, discussed in detail and illustrated below in FIGS. 6-10. The first inlet 510A and the second inlet 510B each are fluidly coupled to at least one passage of a plurality of gas passages to form a labyrinth that connects the inlets 510A and 510B to the plurality of outlets 524.

FIG. 5B shows a mixing plate assembly 500B, including a gas mixture inlet 502 from a separate gas source such as 119 discussed in FIG. 1. The gas mixture inlet 502 branches out into a first gas passage 504A and a second flow path passage 504B, shown here as including right angles that direct gas from the gas mixture inlet 502 into a mixing plate 516 via a first inlet 510A and a second inlet 510B. The mixing plate 516 is defined by four outside edges 508A, 508B, 508C, 508D, as well as a width 508E and a height 508F. The first inlet 510A is fluidly coupled to the first gas passage 504A and the second inlet 510B is fluidly coupled to the second flow passage 504B. The main gas inlet 414 is shown as well, as is the opening 412 that connects a plurality of outlets 524 of the mixing plate 516 to the main gas inlet 414 of a process chamber as discussed in FIG. 4. The plurality of outlets 524 may be located anywhere along the wall of the opening 412, and may vary not only in position but also in dimensions. The mixing plate 516 is shown as being a polygon with sharp corners 514, where the width 508E is less than the height 508F, but may take other shapes such as a rectangle with a varying aspect ratio, a square, a triangle, or other shapes. The "sharp" corners 514 can be configured such that the edges 508C and 508B are at a 90 degree angle to each other.

FIG. 5C shows a mixing plate assembly 500C, including a gas mixture inlet 502 from a separate gas source such as 119 discussed in FIG. 1. The gas mixture inlet 502 branches out into a first gas passage 504A and a second flow path passage 504B, shown here as including right angles that direct gas from the gas mixture inlet 502 into a mixing plate 516 via a first inlet 510A and a second inlet 510B. The first inlet 510A is fluidly coupled to the first gas passage 504A and the second inlet 510B is fluidly coupled to the second gas passage 504B. The main gas inlet 414 is shown as well, as is the opening 412 that connects a plurality of outlets 524 of a mixing plate 518 to the main gas inlet 414 of a process chamber as discussed in FIG. 4. The mixing plate 518 comprises a diameter 520 formed by an outside edge 522 that forms a circular shape of the mixing plate 518, in contrast to the polygonal shapes shown in FIGS. 5A and 5B.

As discussed in FIGS. 5A and 5B, a plurality of passages fluidly connect the inlets 510A and 510B to the outlet passages formed in the opening 412.

While the gas passages 504A and 504B are shown as being of one geometry in FIGS. 5A-5C, in alternate embodiments, the paths may comprise curves, sharp edges, combinations of curved and sharp edges, a serpentine structure, or other path shapes as appropriate for various embodiments. The mixing plates 506, 516, and 518 may be formed from stainless steel or other materials, and the inlets 510A and 510B, while illustrated as being formed from a right angle intersection between the mixing plates' flow path passages 504A, 504B, may in some examples be at an angle α (as shown in FIG. 5C) from 0 degrees to 180 degrees.

Figure 6:
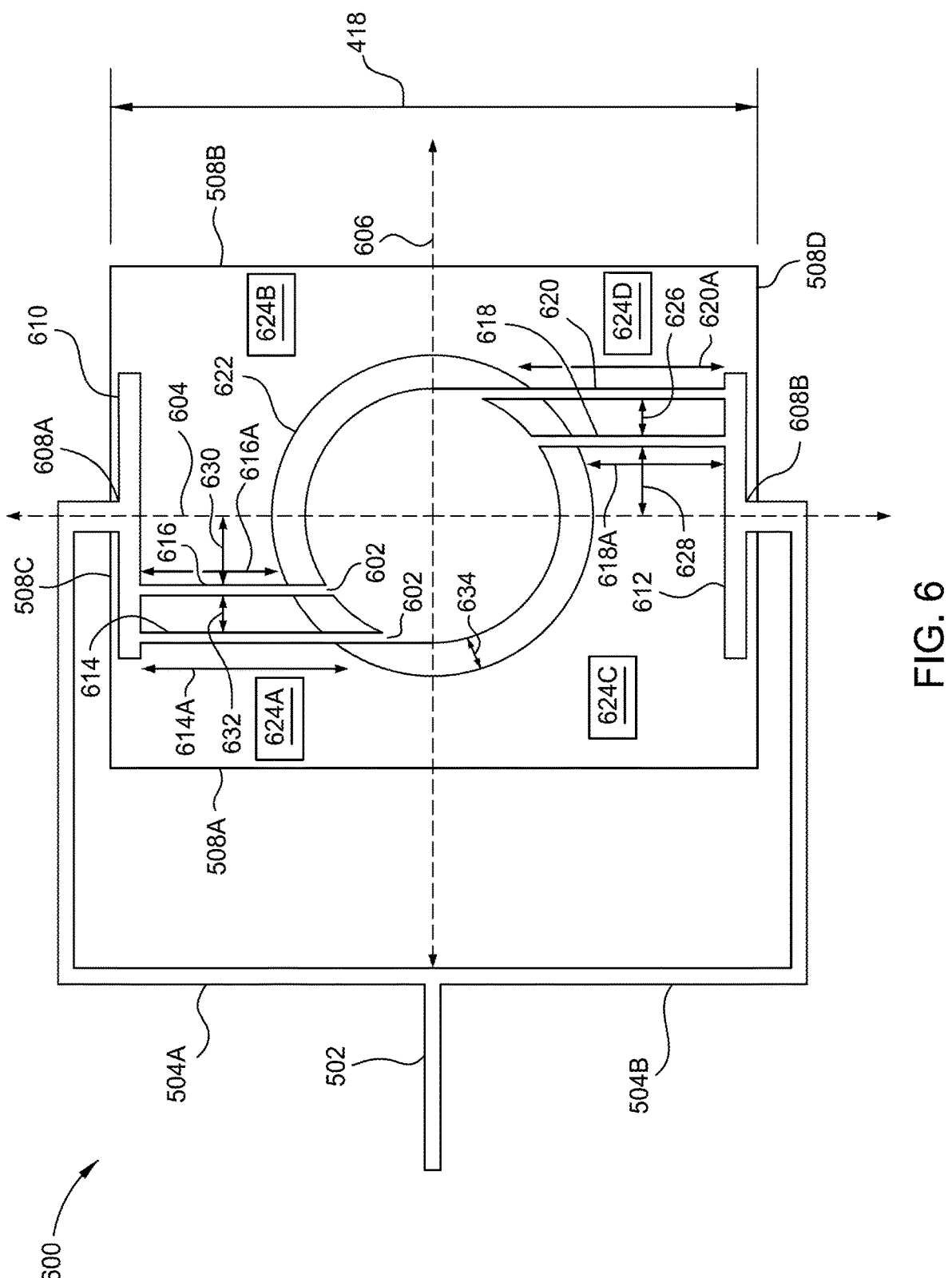
FIG. 6 is an example mixing plate, according to embodiments of the present disclosure.

FIG. 6 is a mixing plate 600 according to embodiments of the present disclosure. FIG. 6 shows a gas mixture inlet 502 from a secondary gas source such as 119 in FIG. 1 as well as the first gas passage 504A and the second gas passage 504B, each of which fluidly connects to the gas mixture inlet 502. The first gas passage 504A is fluidly connected to a first inlet 608A in the mixing plate 600 and the second gas passage 504B is fluidly connected to a second inlet 608B formed in the mixing plate 600. The mixing plate 600 is defined by four quadrants, 624A, 624B, 624C, and 624D, each of which is defined by the intersection of a first axis 606 and a second axis 604. In this example, each of the quadrants 624A, 624B, 624C, and 624D can be further defined by at least two of the outside edges 508A, 508B, 508C, and 508D, as well as a first axis 606 and a second axis 604. The second axis 604 that is perpendicular to the first axis 606 and in the same direction as the plane 418 discussed in FIG. 4 and illustrated here as well. The mixing plate 600 is illustrated as a rectangle with sharp corners, similar to FIG. 5B, but may take the form of any geometry with rounded or sharp corners in the example of a polygonal shape, or may also be a circular shape as shown in FIG. 5C or an elliptical shape.

The first quadrant 624A can thus be defined by the outside edges 508C and 508A as well as the first axis 606 and the second axis 604. The second quadrant 624B can be defined by the edges 508C and 508B as well as the first axis 606 and the second axis 604. The third quadrant 624C can be defined by the edges 508D and 508B as well as the first axis 606 and the second axis 604, and the fourth quadrant 624D can be defined by the outside edges 508A and 508D as well as by the first axis 606 and the second axis 604. An opening 622 shown in the mixing plate 600 is formed through the mixing plate and defined by a wall 634 of the mixing plate 600. The opening 622 is thus perpendicular to the plane 418 in FIG. 4. The opening 622 may be similar to the aperture of the main gas inlet 414 discussed in FIG. 4 above. For ease of illustration, the thickness 634 defines a wall thickness of the opening 622, and a plurality of outlets 602 are formed in the wall, such that a plurality of passages 610, 614, 616, 612, 618, and 620 are formed in the mixing plate 600 to fluidly couple the first inlet 608A to the second inlet 608B from the secondary gas source to the outlets 602. In one example, each outlet of the plurality of outlets 602 has a diameter (as measured perpendicular to the length of each passage) that is from about 1% to about 33% of a diameter of the opening 622.

In the example in FIG. 6, the first quadrant 624A comprises a portion of a first horizontal passage 610 as well as a first vertical passage 614 and a second vertical passage 616. The first horizontal passage 610 is fluidly coupled to the first inlet 608A, and the second horizontal passage 612 is fluidly coupled to the second inlet 608B. Each of the first vertical passage 614 and the second vertical passage 616 is fluidly connected to the first horizontal passage 610 as well as to the outlets 602 and has a height, respectively, of 614A and 616A. The first vertical passage 614 is spaced a distance of 632 (intra-passage spacing) from the second vertical passage 616, and the second vertical passage 616 is spaced a distance 630 from the second axis 604.

The second quadrant 624B comprises a different portion of the first horizontal passage 610 than the first quadrant 624A where carrier gas may build up in order to increase a pressure of the gas mixture entering the chamber (not shown) via the outlets 602. The third quadrant 624C comprises a portion of a second horizontal passage 612 where carrier gas may build up in order to increase a pressure of the gas mixture entering the chamber (not shown) via the outlets 602. The fourth quadrant 624D comprises a different portion of the second horizontal passage 612 as well a third vertical passage 618 and a fourth vertical passage 620 vertical passage, each defined in part by respective heights 618A and 620A. Each of the third vertical passage 618 and the fourth vertical passage 620 is fluidly connected to the second horizontal passage 612 as well as to the outlets 602. The third vertical passage 618 is spaced a distance of 628 from the second axis 604, and the fourth vertical passage 620 is spaced a distance of 626 (intra-passage spacing) from the third vertical passage 618.

Further in FIG. 6, the first vertical passage 614 and the fourth vertical passage 620 are disposed with respective outlets 602 along the inner wall of the opening 622. Thus, carrier gas fed through the first vertical passage 614 and the fourth vertical passage 620 is introduced to the plasma flow along the sidewalls. As such, the first vertical passage 614 and the fourth vertical passage 620 may each have an increased velocity as compared to carrier gas fed through the second vertical passage 616 and the third vertical passage 618, each of which is introduced to the plasma flow closer towards the center of the plasma flow. The mixing of the plasma with the carrier gas from the second vertical passage 616 and the third vertical passage 618 can be further promoted by the vortex formation discussed above. In some examples, the second vertical passage 616 and the third vertical passage 618 can further contribute to vortex formation.

In one example, the height 616A of the second vertical passage 616 is the same as the height 618A of the third vertical passage 618. In another example, the height 614A of the first vertical passage 614 is the same as the height 620A of the fourth vertical passage 620. In alternate embodiments, the respective heights of each of the vertical passages of the mixing plate 600 may differ. Similarly, the intra-passage spacing's 626 and 632 may be the same or different. In various examples, the distances 628 and 630. While the vertical passages 614, 616, 618, and 620 are shown as being substantially perpendicular to each of the first horizontal passage 610 and the second horizontal passage 612, in other examples, it is contemplated that one or more of the vertical passages may be formed at an angle from 0 to 180 degrees with respect to the horizontal passages. Thus, a gas mixture is introduced to the mixing plate 600 via the gas mixture inlet 502, and exits the mixing plate 600 via the outlets 602 into the plasma stream from the RPS.

Four vertical passages (614, 616, 618, and 620) are shown in the example in FIG. 6. However, it is contemplated that, in other examples, a mixing plate such as the mixing plate 600 can include only two vertical passages. In this example, the two vertical passages can be located cattycorner, such as the first vertical passage 614 and the third vertical passage 618, or the second vertical passage 616 and the fourth vertical passage 620. The vertical passages can be disposed in this manner to use the carrier gas to create and/or maintain a vortex in the plasma while the plasma is in the plasma conduit, as discussed above with respect to FIG. 4. The plasma vortex promotes mixing of the plasma and the carrier gas, and promotes a more even distribution of the plasma in the process chamber. While passages may be referred to as "vertical" or "horizontal" herein, it is contemplated that each passage may take various shapes (straight, curved, stepped) and may be at various angles with respect to the first axis 606 and the second axis 604.

Figure 7:
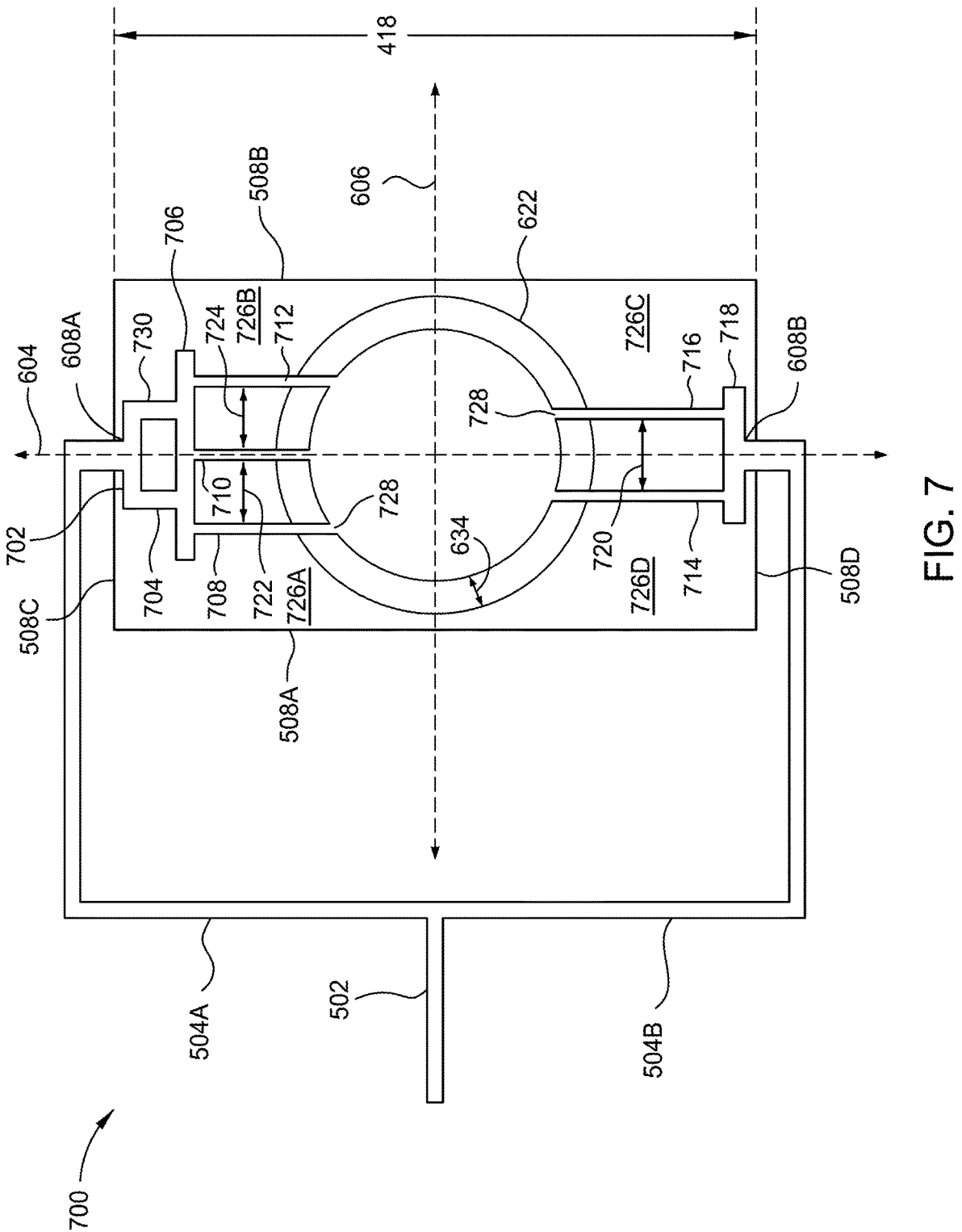
FIG. 7 is an example mixing plate, according to embodiments of the present disclosure.

FIG. 7 is an example mixing plate 700 according to embodiments of the present disclosure. FIG. 7 shows a gas mixture inlet 502 from a secondary gas source such as 119 in FIG. 1 as well as the first gas passage 504A and the second gas passage 504B, each of which fluidly connects to the gas mixture inlet 502. The first gas passage 504A is fluidly connected to a first inlet 608A in the mixing plate 700 and the second gas passage 504B is fluidly connected to a second inlet 608B formed in the mixing plate 700. The mixing plate 700 is defined by four quadrants, 726A, 726B, 726C, and 726D, each defined a first axis 606 and a second axis 604. In some examples, the quadrants 726A-726D are defined by the second axis 604 that is perpendicular to the first axis 606 and in the same direction as the plane 418 discussed in FIG. 4. In other examples, the quadrants 726A-726D can be further defined by at least two of the outside edges 508A, 508B, 508C, and 508D, as well as the first axis 606 and the second axis 604.

The mixing plate 700 is illustrated as being a rectangle with sharp corners, similar to FIG. 5B, but may take the form of any geometry with rounded or sharp corners in the example of a polygonal shape. In other examples, the mixing plate can be a circular shape as shown in FIG. 5C or an elliptical shape. When the mixing plate has a circular or elliptical shape, each quadrant is defined by the intersection of the first axis 606 and the second axis 604 and can be further defined by an outside edge of the circular or elliptical shape.

The first quadrant 726A can be defined by the edges 508C and 508A as well as the first axis 606 and the second axis 604. The second quadrant 726B can be defined by the edges 508C and 508B as well as the first axis 606 and the second axis 604. The third quadrant 726C can be defined by the edges 508D and 508B as well as the first axis 606 and the second axis 604, and the fourth quadrant 726D can be defined by the edges 508A and 508D as well as by the first axis 606 and the second axis 604. An opening 622 shown in the mixing plate 700 is formed through the mixing plate 700 and defined by a wall 634 of the mixing plate 700. The opening 622 is thus perpendicular to the plane 418 in FIG. 4. For ease of illustration, the thickness 634 defines a wall thickness defining the opening 622. A plurality of outlets 728 are formed in the wall defining the opening 622, such that a plurality of passages 702, 704, 706, 708, 710, 712, 714, 716, and 718 are formed in the mixing plate 700 to fluidly couple the first inlet 608A and the second inlet 608B from the secondary gas source to the outlets 728.

In the example in FIG. 7, the first quadrant 726A comprises a portion of a first horizontal passage 702 and is fluidly coupled to the first inlet 608A and a first vertical passage 704. The first vertical passage 704 is fluidly coupled to a portion of a second horizontal passage 706. The second horizontal passage 706 is fluidly coupled to a second vertical passage 708. A third vertical passage 710 is formed along the second axis 604 such that the third vertical passage 710 lies between the first quadrant 726A and the second quadrant 726B. The second quadrant 726B further comprises another portion of the first horizontal passage 702 and the second horizontal passage 706, which are fluidly connected by a fourth vertical passage 730. The portion of the second horizontal passage 706 in the second quadrant 726B is fluidly connected to a fifth vertical passage 712. The second vertical passage 708 and third vertical passage 710 are separated by a distance of 722 which may be equal to, less than, or greater than a distance 724 between the third vertical passage 710 and fifth vertical passage 712. The third quadrant 726C comprises a portion of a third horizontal passage 718 and is fluidly coupled to the second inlet 608B and a sixth vertical passage 714. The fourth quadrant 726D comprises a different portion of the third horizontal passage 718 that is fluidly coupled to the second inlet 608B and a seventh vertical passage 716.

The vertical passages 708, 710, 712, 714, and 716 are each fluidly coupled to an outlet 728. The sixth vertical passage 714 and seventh vertical passage 716 are separated by a distance 720 and are each spaced equidistant from the second axis 604. The distance 720 may be the same as, less than, or greater than each or both of the spacing distances 722 and 724. While the vertical passages 708, 710, 712, 714, and 716 are shown as being substantially perpendicular to each horizontal passage 702, 706, and 718, in other examples, one or more of the vertical passages may be formed at an angle from 0 to 180 degrees with respect to the horizontal passages. Thus, a gas mixture is introduced to the mixing plate 700 via the gas mixture inlet 502, and exits the mixing plate 700 via the outlets 728.

Figure 8:
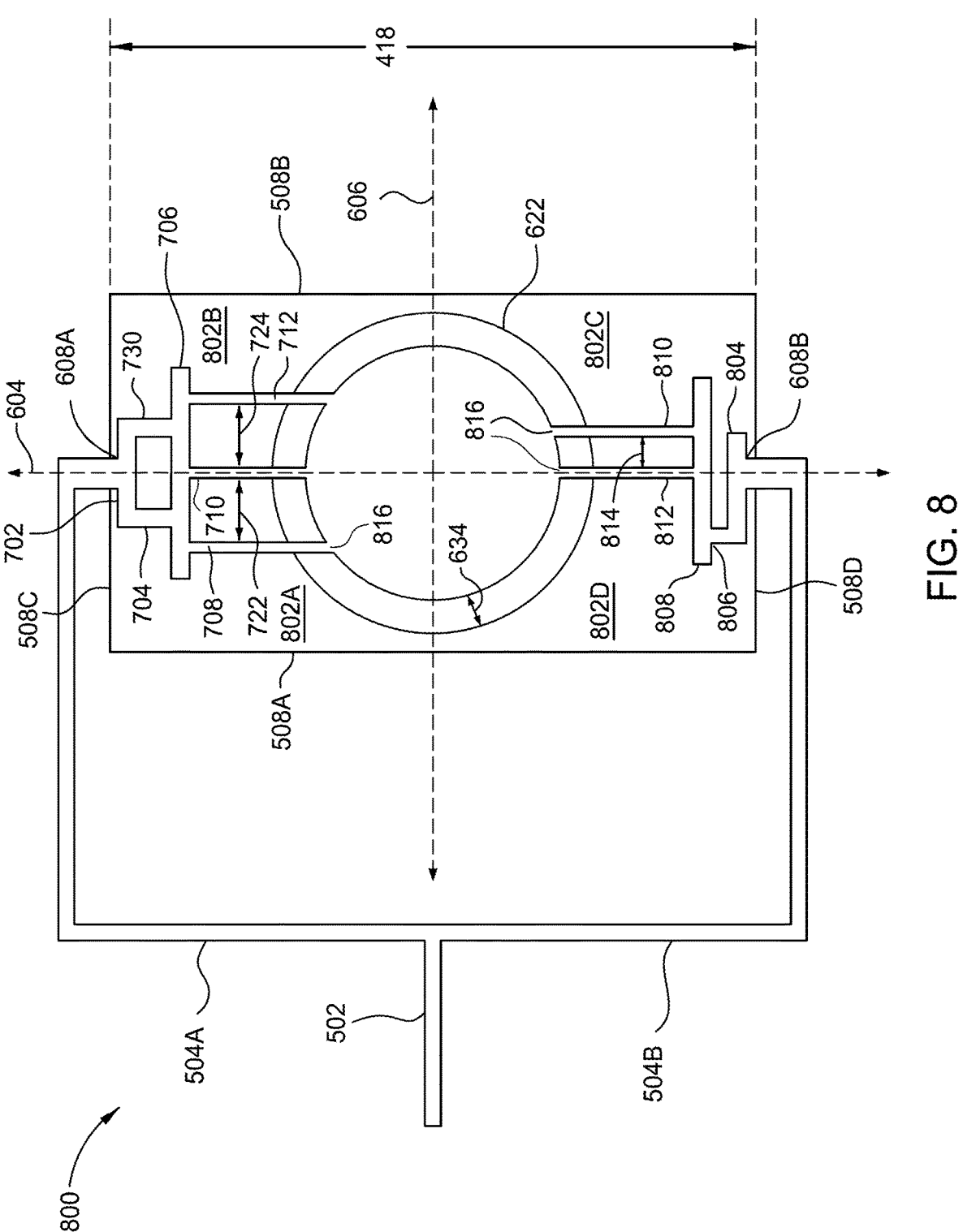
FIG. 8 is an example mixing plate, according to embodiments of the present disclosure.

FIG. 8 is an example mixing plate 800 according to embodiments of the present disclosure. FIG. 8 shows a gas mixture inlet 502 from a secondary gas source such as 119 in FIG. 1 as well as the first gas passage 504A and the second gas passage 504B, each of which fluidly connects to the gas mixture inlet 502. The first gas passage 504A is fluidly connected to a first inlet 608A in the mixing plate 800. The second gas passage 504B is fluidly connected to the second inlet 608B formed in the mixing plate 800. The mixing plate 800 is defined by four quadrants, 802A, 802B, 802C, and 802D, each defined by a first axis 606 and a second axis 604, and each of which can be further defined at least two of the outside edges 508A, 508B, 508C, and 508D. The second axis 604 is perpendicular to the first axis 606 and in the same direction as the plane 418 discussed in FIG. 4.

The mixing plate 800 is illustrated as a rectangle with sharp corners, similar to FIG. 5B, but may take the form of any geometry with rounded or sharp corners in the example of a polygonal shape, but which may also be a circular shape as shown in FIG. 5C or an elliptical shape. The first quadrant 802A can be defined by the edges 508C and 508A as well as the first axis 606 and the second 604. The second quadrant 802B can be defined by the edges 508C and 508B as well as the first axis 606 and the second axis 604. The third quadrant 802C can be defined by the edges 508D and 508B as well as the first axis 606 and the second axis 604, and the fourth quadrant 802D can be defined by the edges 508A and 508D as well as by the first axis 606 and the second axis 604. An opening 622 is shown in the mixing plate 800 and is formed through the mixing plate and defined by a wall 634 of the mixing plate 800. The opening 622 is thus perpendicular to the plane 418 in FIG. 4. For ease of illustration, the wall 634 defines a wall thickness of the opening 622, and a plurality of outlets 816 are formed in the wall. For example, a plurality of passages 702, 704, 706, 708, 710, 712, 804, 806, 808, 810, and 812 are formed in the mixing plate 800 to fluidly couple the first inlet 608A and the second inlet 608B from the secondary gas source to the outlets 816. Thus, the gas mixture from the gas mixture inlet 502 combines with plasma from the RPS as the gas mixture and plasma are transferred into a process chamber.

In the example in FIG. 8, the first quadrant 802A comprises a portion of a first horizontal passage 702, fluidly coupled to a first vertical passage 704 which is fluidly coupled to both the first inlet 608A and a portion of a second horizontal passage 706. The second horizontal passage 706 is fluidly coupled to a second vertical passage 708. A third vertical passage 710 is formed along the second axis 604 such that is lays between the first quadrant 802A and the second quadrant 802B. The second quadrant 802B further comprises another portion of the first horizontal passage 702 and the second horizontal passage 706, which are fluidly connected by a fourth vertical passage 730. The portion of the second horizontal passage 706 in the second quadrant 802B is fluidly connected to a fifth vertical passage 712. The second vertical passage 708 and third vertical passage 710 are separated by a distance of 722. The distance 722 can be equal to, less than, or greater than a distance 724 between the third vertical passage 710 and fifth vertical passage 712.

The third quadrant 802C comprises a portion of a third horizontal passage 804 fluidly coupled to the second inlet 608B and a sixth vertical passage 806, which is fluidly coupled to a portion of a fourth horizontal passage 808. The fourth horizontal passage 808 is fluidly coupled to a seventh vertical passage 812, which is formed along the second axis 604 and is partially in the third quadrant 802C and partially in the fourth quadrant 802D. The fourth quadrant 802D comprises a different portion of the third horizontal passage 804 and the fourth horizontal passage 808, which is fluidly coupled to a fifth vertical passage 712. The seventh vertical passage 812 and the sixth vertical passage 810 are separated by a distance 814. Each of the seventh vertical passage 812 and the sixth vertical passage 810 can be of varying lengths, and each is fluidly coupled to an outlet 816. Similarly, the vertical passages 708, 710, 712, 810, and 812 are each fluidly coupled to one or more of the outlets 816. The sixth vertical passage 714 and seventh vertical passage 716 are separated by a distance of 720.

Each of the sixth vertical passage 714 and the seventh vertical passage 716 is spaced equidistant from the second axis 604. The distance between the sixth vertical passage 810 and seventh vertical passage 812 may be the same as, less than, or greater than each or both of the spacing distances 722 and 724. While the vertical passages 708, 710, 712, 810, and 812 are shown as being substantially perpendicular to each horizontal passage 702, 706, 804, and 808, in other examples, one or more of the vertical passages may be formed at an angle from 0 to 180 degrees with respect to the horizontal passages. In the example mixing plate 800, the seventh vertical passage 812 and the third vertical passage 710 are formed along the second axis 604 and thus aligned with each other along the second axis 604. Thus, a gas mixture is introduced to the mixing plate 800 via the gas mixture inlet 502, and exits the mixing plate 800 via the outlets 816. While the terms "vertical" and "horizontal" are used herein for passage orientations, it is noted that the term is used only for clarity and explanation purposes, and that other orientations are contemplated.

Figure 9:
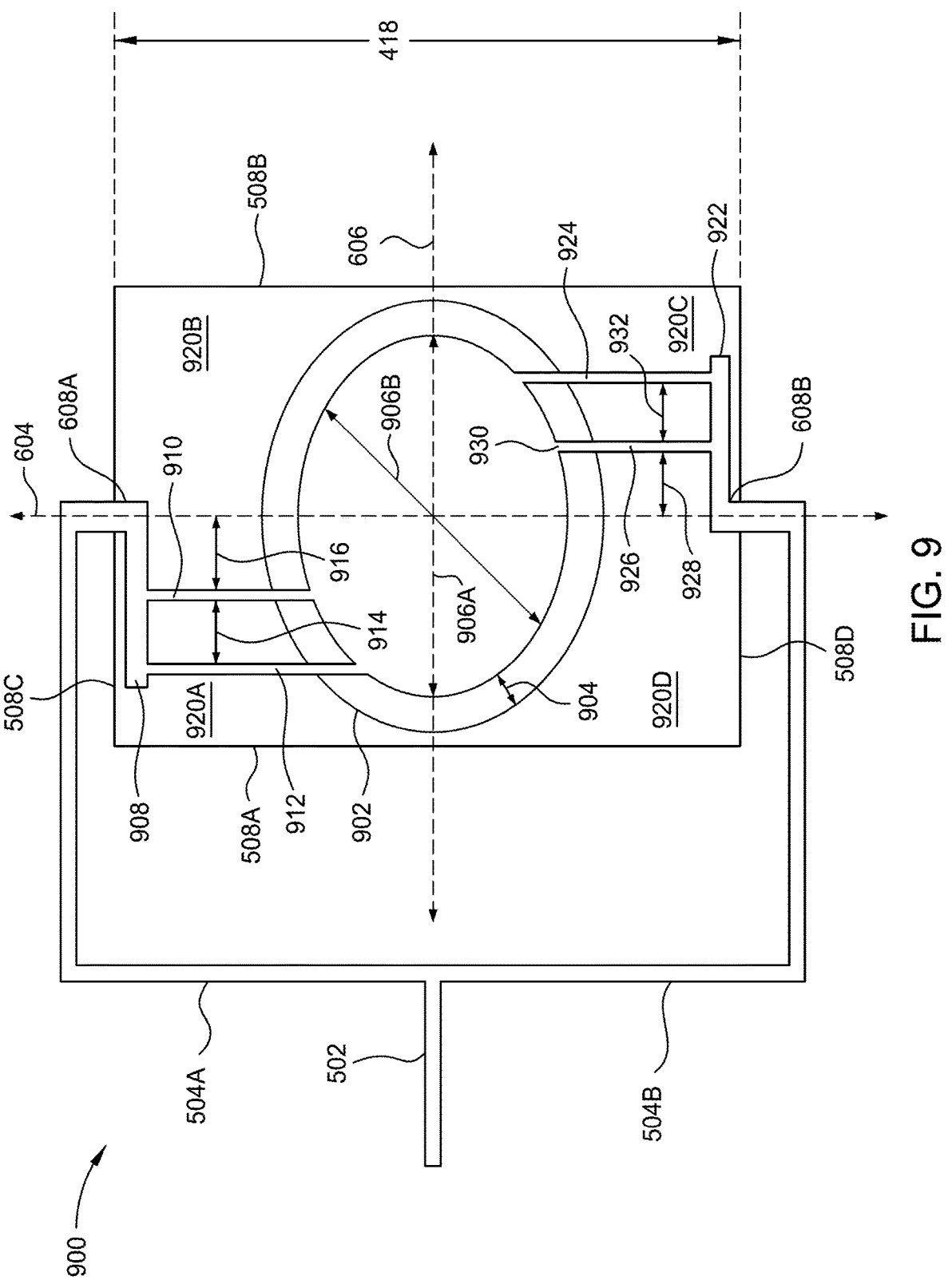
FIG. 9 is an example mixing plate, according to embodiments of the present disclosure.

FIG. 9 illustrates a mixing plate 900 according to embodiments of the present disclosure. FIG. 9 shows a gas mixture inlet 502 from a secondary gas source such as 119 in FIG. 1 as well as the first gas passage 504A and the second gas passage 504B, each of which fluidly connects to the gas mixture inlet 502. The first gas passage 504A is fluidly connected to a first inlet 608A in the mixing plate 900 and the second gas passage 504B is fluidly connected to the second inlet 608B formed in the mixing plate 800. The mixing plate 900 is defined by four quadrants, 920A, 920B, 920C, and 920D, each defined by a first axis 606 and a second axis 604, and each of which may be further defined by at least two of the outside edges 508A, 508B, 508C, and 508D. The second axis 604 that is perpendicular to the first axis 606 and in the same direction as the plane 418 discussed in FIG. 4. The mixing plate 900 is illustrated as a rectangle with sharp corners, similar to FIG. 5B. The mixing plate 900 may alternatively take the form of any geometry with rounded or sharp corners in the example of a polygonal shape, but may also be a circular shape as shown in FIG. 5C or an elliptical shape. The first quadrant 920A can be defined by the edges 508C and 508A as well as the first axis 606 and the second axis 604, the second quadrant 920B can be defined by the edges 508C and 508B as well as the first axis 606 and the second axis 604. The third quadrant 920C can be defined by the edges 508D and 508B as well as the first axis 606 and the second axis 604; and the fourth quadrant 920D can be defined by the edges 508A and 508D as well as by the first axis 606 and the second axis 604.

An opening 902 is shown in the mixing plate 900 and is formed through the mixing plate and defined by a wall, shown by the thickness 904 of the mixing plate 900. The opening 902 is thus perpendicular to the plane 418 in FIG. 4. The opening 902 may be formed as a circle as shown in FIGS. 6-8, or may be an elliptical shape as shown here, such that a first diameter 906A is greater than a second diameter 906B. For ease of illustration, the thickness 904 defines a thickness of the opening 902, and a plurality of outlets 930 are formed in the wall, such that a plurality of passages 908, 910, 912, 922, 926, and 924 are formed in the mixing plate 900 to fluidly couple the inlets 608A and 608B from the secondary gas source to the outlets 930, such that the gas mixture from the gas mixture inlet 502 combine with plasma from the RPS as the gas mixture and plasma are transferred into a process chamber.

In the example in FIG. 9, the first quadrant 920A comprises a first horizontal passage 908, fluidly coupled to the first inlet 608A and a first vertical passage 912 which is fluidly coupled to the outlet 930. The first horizontal passage 908 is also coupled to a second vertical passage 910, which is further coupled to an outlet 930 of the plurality of outlets. The second quadrant 920B does not comprise passages, and though a portion of the first inlet 608A is located in that quadrant, no gas mixture is passed through the second quadrant 920B other than that in the first inlet 608A. The first vertical passage 912 and the second vertical passage 910 are separated by a distance of 914, which may be less than, greater than, or equal to a distance 916 that separates the second vertical passage 910 from the second axis 604. While both of the first inlet 608A and the second inlet 608B are shown as being located along the shared second axis 604, in other embodiments, the inlets may be offset along the second axis 604, for example, along the first axis 606.

The third quadrant 920C comprises a second horizontal passage 922 that is fluidly connected to the second inlet 608B and to each of a third vertical passage 926 and a fourth vertical passage 924. Each of the third vertical passage 926 and fourth vertical passage 924 are fluidly coupled to separate outlets 930. While separate outlets 930 are associated with each vertical passage (912, 910, 926, and 924) in the mixing plate 900, in another example, two or more passages may share an inlet (e.g., another passage) or an outlet 930. The third vertical passage 926 and fourth vertical passage 924 vertical passage are separated by a distance 932, which may be less than, greater than, or equal to a distance 928 between the second axis 604 and the third vertical passage 926.

The fourth quadrant 920D does not comprise passages, and though a portion of the second inlet 608B is located in that quadrant, no gas mixture is passed through the fourth quadrant 920D other than that in the second inlet 608B. While the vertical passages 912, 910, 926, and 924 are shown as being substantially perpendicular to each horizontal passage 908 and 922, in other examples, one or more of the vertical passages may be formed at an angle from 0 to 180 degrees with respect to the horizontal passages. In the mixing plate 900, the vertical passages 912, 910, 926, and 924 are not aligned with each other along either axis 604 or 606. Thus, a gas mixture is introduced to the mixing plate 900 via the gas mixture inlet 502, and exits the mixing plate 900 via the outlets 930.

Figure 10:
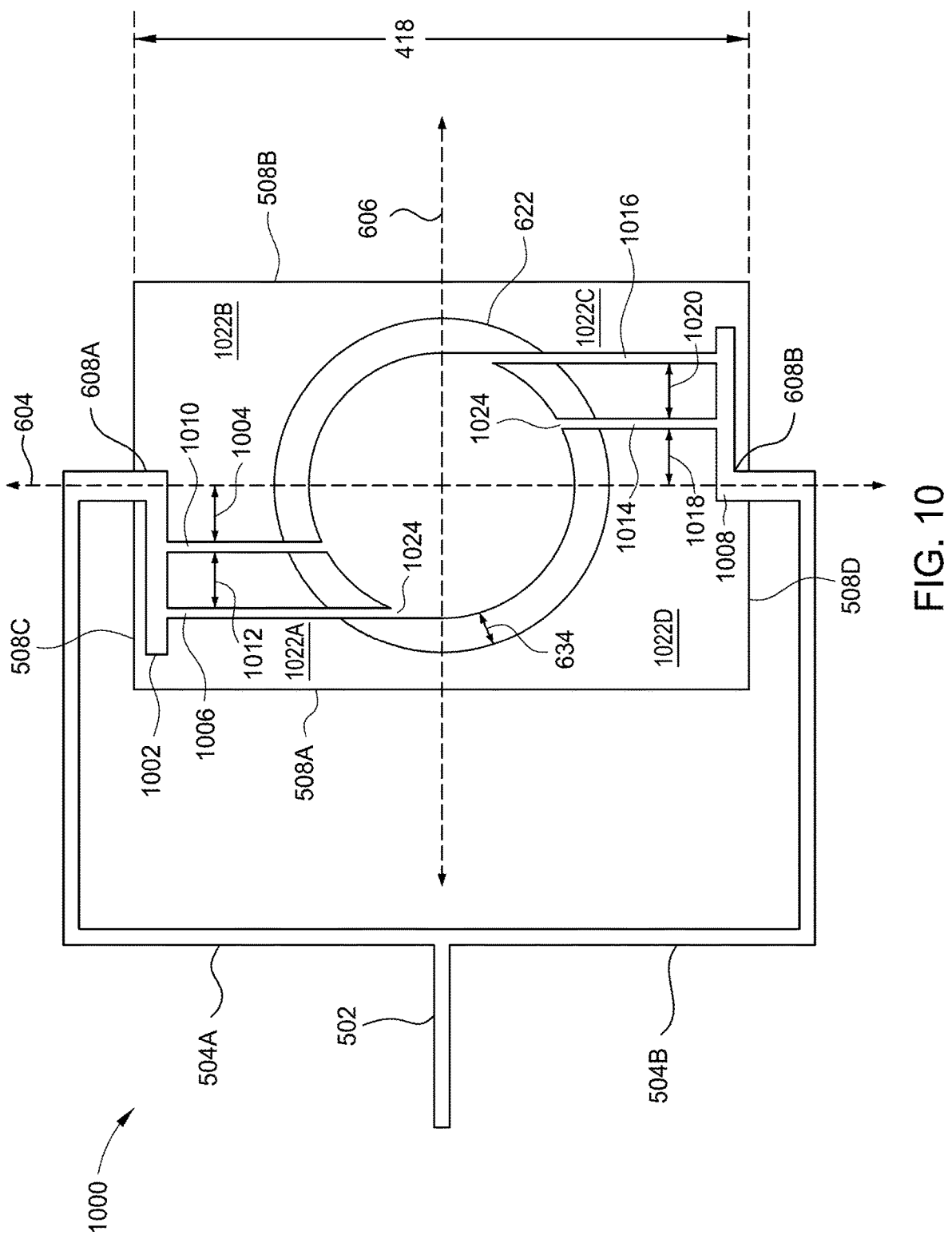
FIG. 10 is an example mixing plate, according to embodiments of the present disclosure.

FIG. 10 illustrates a mixing plate 1000 according to embodiments of the present disclosure. FIG. 10 shows a gas mixture inlet 502 from a secondary gas source such as 119 discussed with respect to FIG. 1 as well as the first gas passage 504A and the second gas passage 504B, each of which fluidly connects to the gas mixture inlet 502. The first gas passage 504A is fluidly connected to a first inlet 608A in the mixing plate 900 and the second gas passage 504B is fluidly connected to the second inlet 608B formed in the mixing plate 800. The mixing plate 1000 is defined by four quadrants, 1022A, 1022B, 1022C, and 1022D, each defined by a first axis 606 and a second axis 604.

In some embodiments, each quadrant 1022A-1022D can be further defined by at least two of the outside edges 508A, 508B, 508C, and 508D. The second axis 604 is perpendicular to the first axis 606 and in the same direction as the plane 418 discussed in FIG. 4. The mixing plate 1000 is illustrated as a rectangle with sharp corners, similar to FIG. 5B, but may take the form of any geometry with rounded (as in FIG. 5A) or sharp corners in the example of a polygonal shape, or may be a circular shape as shown in FIG. 5C or an elliptical shape. The first quadrant 1022A can be thus defined by the edges 508C and 508A as well as the first axis 606 and the second axis 604, the second quadrant 1022B can be defined by the edges 508C and 508B as well as the first axis 606 and the second axis 604. The third quadrant 1022C can be defined by the edges 508D and 508B as well as the first axis 606 and the second axis 604; and the fourth quadrant 1022D can be defined by the edges 508A and 508D as well as by the first axis 606 and the second axis 604.

An opening 622 is shown in the mixing plate 1000 and is formed through the mixing plate and defined by a wall 634 of the mixing plate 1000. The opening 622 is thus perpendicular to the plane 418 in FIG. 4. A plurality of outlets 1024 are formed in the wall 634, such that a plurality of passages 1002, 1004, 1006, 1008, 1014, 1016 are formed in the mixing plate 1000 to fluidly couple the first inlet 608A and the second inlet 608B from the secondary gas source to the outlets 1024, such that the gas mixture from the gas mixture inlet 502 combine with plasma from the RPS as the gas mixture and plasma are transferred into a process chamber. Thus, a flow path from the gas mixture inlet 502 to the chamber via the opening 622 is established via the first inlet 608A and the second inlet 608B, the passages 1002, 1004, 1006, 1008, 1014, and 1016, and the outlets 1024, each of which is connected to at least one vertical passage as discussed below.

In the example in FIG. 10, the first quadrant 1022A comprises a first horizontal passage 1002 that is fluidly coupled to the first inlet 608A and a first vertical passage 1006 which is further fluidly coupled to an outlet 1024. The first horizontal passage 1002 is also coupled to a second vertical passage 1004, which is further coupled to an outlet 1024 of the plurality of outlets that is shown here as being a different outlet 1024 than that coupled to the passage 1004, but which may, in some embodiments, be a shared outlet between two or more vertical passages.

The second quadrant 10226 does not comprise passages. Though a portion of the first inlet 608A is located in the second quadrant 1022B, no gas mixture is passed through the second quadrant 1022B other than that in the first inlet 608A. The first vertical passage 1006 and the second vertical passage 1004 are separated by a distance of 1012, which may be less than, greater than, or equal to a distance 1010 that separates the second vertical passage 1004 from the second axis 604. While both the first inlet 608A and the second inlet 608B are shown as being located along the shared second axis 604, in other embodiments, the inlets may be offset along that axis 604, for example, along the first axis 606, or may be angled at an angle other than 90 degrees relative to the first axis 606.

The third quadrant 1022C comprises a second horizontal passage 1008, fluidly connected to the second inlet 608B as well as to a third vertical passage 1014 and a fourth vertical passage 1016. Each of the third vertical passage 1014 and fourth vertical passage 1016 are fluidly coupled to separate outlets 1024, but can, in some embodiments, share an outlet 1024. The third vertical passage 1014 and fourth vertical passage 1016 are separated by a distance 1020, which may be less than, greater than, or equal to a distance 1018 between the second axis 604 and the third vertical passage 1014.

The fourth quadrant 1022D does not comprise passages. Though a portion of the second inlet 608B is located in that quadrant, no gas mixture is passed through the fourth quadrant 1022D other than that in the second inlet 608B. While the vertical passages 1004, 1006, 1014, and 1016 are shown as being substantially perpendicular to each horizontal passage 1002 and 1008, in other examples, one or more of the vertical passages 1004, 1006, 1014, or 1016 may be formed at an angle from 0 to 180 degrees with respect to the horizontal passages 1002 and 1008. In the mixing plate 1000, the vertical passages 1004, 1006, 1014, and 1016 are not aligned with each other along either axis 604 or 606. Thus, a gas mixture is introduced to the mixing plate 1000 via the gas mixture inlet 502, and exits the mixing plate 1000 via the outlets 1024.

Figure 11:
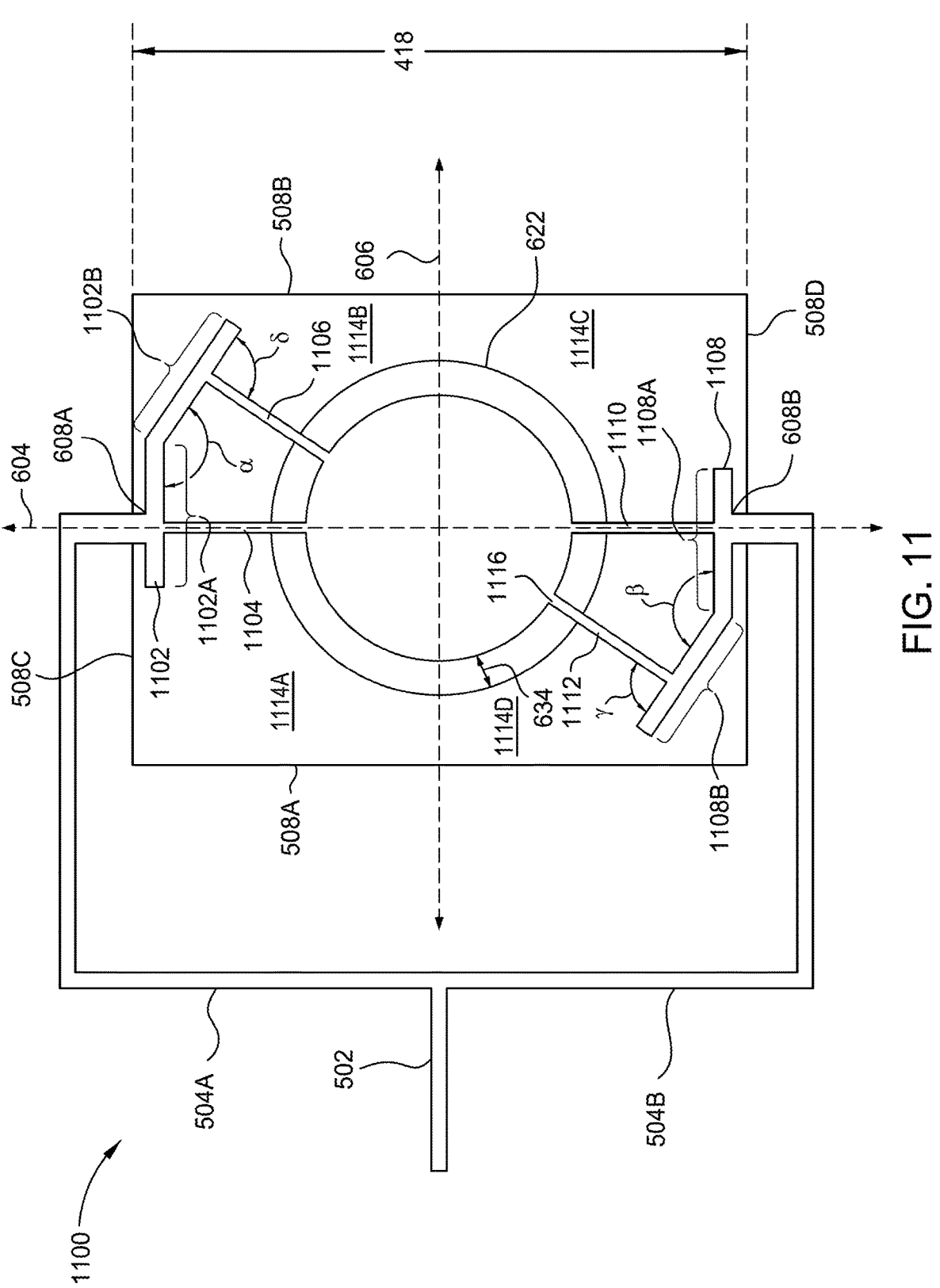
FIG. 11 is an example mixing plate, according to embodiments of the present disclosure.

FIG. 11 illustrates a mixing plate 1100 according to embodiments of the present disclosure. FIG. 11 shows a gas mixture inlet 502 from a secondary gas source such as 119 in FIG. 1 as well as the first gas passage 504A and the second gas passage 504B, each of which fluidly connects to the gas mixture inlet 502. The first gas passage 504A is fluidly connected to a first inlet 608A in the mixing plate 1100 and the second gas passage 504B is fluidly connected to the second inlet 608B formed in the mixing plate 800. The mixing plate 1100 is defined by four quadrants, 1114A, 1114B, 1114C, and 1114D, each defined by a first axis 606 and a second axis 604, and, in some embodiments, further defined by at least two of the outside edges 508A, 508B, 508C, and 508D. The second axis 604 is perpendicular to the first axis 606 and in the same direction as the plane 418 discussed in FIG. 4. The mixing plate 1100 is illustrated as a rectangle with sharp corners, similar to FIG. 5B, but may take the form of any geometry with rounded or sharp corners in the example of a polygonal shape, or may be a circular shape as shown in FIG. 5C or an elliptical shape. The first quadrant 1114A can be thus defined by the edges 508C and 508A as well as the first axis 606 and the second axis 604; the second quadrant 1114B can be defined by the edges 508C and 508B as well as the first axis 606, the second axis 604. The third quadrant 1114C can be defined by the edges 508D and 508B as well as the first axis 606, the second axis 604; and the fourth quadrant 1114D can be defined by the edges 508A and 508D as well as by the first axis 606, the second axis 604.

An opening 622 is shown in the mixing plate 1100 and is formed through the mixing plate and defined by a wall 634 of the mixing plate 1100. The opening 622 is thus perpendicular to the plane 418 in FIG. 4. A plurality of outlets 1116 are formed in the wall 634, such that a plurality of passages 1102, 1104, 1106, 1108, 1110, 1112 are formed in the mixing plate 1100 to fluidly couple the first inlet 608A to the second inlet 608B from the secondary gas source to the outlets 1116. The gas mixture from the gas mixture inlet 502 combines with plasma from the RPS as the gas mixture and plasma are transferred into a process chamber. Thus, a flow path from the gas mixture inlet 502 to the chamber via the opening 622 is established via the first inlet 608A to the second inlet 608B, the passages 1102, 1104, 1106, 1108, 1110, 1112 and the outlets 1116, each of which is connected to at least one vertical passage as discussed below.

In the example in FIG. 11, the first quadrant 1114A comprises a portion of a first horizontal passage 1102 that is perpendicular to the second axis 604 and that may be used to build up gas mixture pressure to move the gas mixture through other passages. The second quadrant 1114B comprises a first horizontal passage 1102 that is fluidly coupled to the first inlet 608A and to a first vertical passage 1104 which is fluidly coupled to an outlet 1116. The first vertical passage 1104 may be said to be in both the first quadrant 1114A and the second quadrant 1114B since the first vertical passage 1104 is aligned with the second axis 604. The first horizontal passage 1102 comprises a first portion 1102A coupled to the first vertical passage 1104, the first portion 1102A is parallel to the first axis 606.

A second portion 1102B of the first horizontal passage 1102 is at an angle $\alpha$ with respect to the first axis 606, and a second passage 1106 is coupled to the second portion 1102B as well as to an outlet 1116. The angle $\alpha$ may be from 90 degrees to about 180 degrees, such as about 120 degrees to about 150 degrees. The second passage 1106 can be at an angle of $\delta$ with respect to the second portion 1102B. The angle $\delta$ can be from −10 degrees to +170 degrees, depending upon the embodiment. In one example, the angle $\delta$ is within a range of about 85 degrees about 95 degrees, such as 90 degrees. While the first vertical passage 1104 and the second passage 1106 are shown as associated with separate outlets 1116, in alternate embodiments, two or more vertical passages share a single outlet 1116.

The third quadrant 1114C comprises a second horizontal passage 1108 that is fluidly coupled to the second inlet 608B and to a third vertical passage 1110 which is fluidly coupled to an outlet 1116. In one example, the second horizontal passage 1108 comprises a first portion 1108A coupled to the third vertical passage 1110 and the first portion 1108A is parallel to the first axis 606. A second portion 1108B of the second horizontal passage 1108 is at an angle $\beta$ with respect to the first axis 606, and a fourth passage 1112 is coupled to the second portion 1108B as well as to an outlet 1116. The angle $\beta$ may be from 90 degrees to about 180 degrees, such as about 120 degrees to about 150 degrees. The fourth passage 1112 can be at an angle of $\gamma$ with respect to the second portion 1108B, the angle $\gamma$ can be from 10 degrees to 170 degrees, depending upon the embodiment. In one example, the angle $\gamma$ is 85 degrees to about 95 degrees, such as 90 degrees.

While the third vertical passage 1110 and the fourth passage 1112 are illustrated as being associated with separate outlets 1116, in alternate embodiments, two or more vertical passages share a single outlet 1116. In one example, the third vertical passage 1110 may not be vertical with respect to the first axis 606 as other vertical passages discussed herein. The fourth quadrant 1114D comprises a portion of the second horizontal passage 1108 that is perpendicular to the second axis 604 and that may be used to build up gas mixture pressure to move the gas mixture through other passages. Thus, a gas mixture is introduced to the mixing plate 1100 via the gas mixture inlet 502, and exits the mixing plate 1100 via the outlets 1116.

Figure 12:
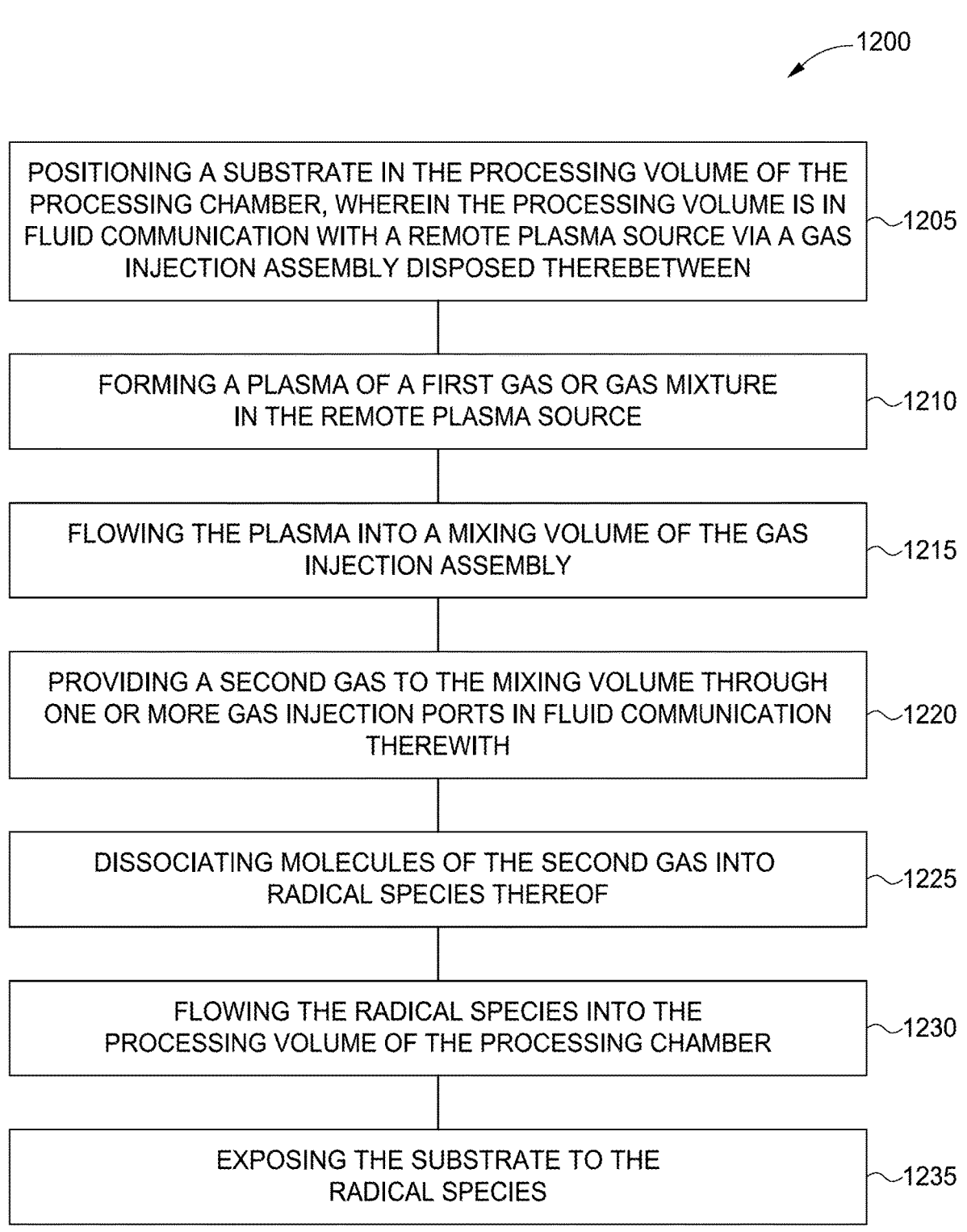
FIG. 12 is a flow diagram of a method of processing a substrate, according to embodiments of the disclosure.

FIG. 12 is a flow diagram of a method 1200 of providing at least metastable radical molecular and/or radical atomic species to the processing volume of a process chamber. At operation 1205 the method 1200 includes positioning a substrate in the processing volume of the process chamber, where the processing volume is in fluid communication with a remote plasma source via a gas injection assembly disposed therebetween. In some embodiments, the process chamber is a rapid thermal processing (RTP) chamber, such as the process chamber 102 described in FIG. 1A. At operations 1210 and 1215 the method 1200 respectively includes forming a plasma of a first gas or a first gas mixture in the remote plasma source and flowing the plasma into a mixing volume of a gas injection assembly, such as the gas injection assemblies 103, 203, or 303 described in FIGS. 1-3.

At operation 1220 the method 1200 includes flowing a second gas to the mixing volume of the gas injection assembly through one or more gas injection ports in fluid communication therewith. At operation 1225 the method 1200 includes dissociating molecules of the second gas into molecular and/or radical atomic species thereof. Herein, dissociating molecules of the second gas into the radical species thereof comprises colliding radicals, ions, and other charged particles of the plasma with molecules of the second gas in the mixing volume of the gas injection assembly. At operation 1230, the method 1200 includes introducing the radical species into the processing volume of the process chamber.

At operation 1235 the method includes exposing the substrate to the radical species. In some embodiments, the method 1200 further includes heating the substrate to a processing temperature between about 500° C. and about 1100° C., such as between about 500° C. and about 1000° C., or less than about 1000° C., such as less than about 900° C., for example less than about 850° C. In some embodiments of the method 1200, heating the substrate includes directing radiant energy towards a device side surface thereof. In one embodiment, the device side surface of the substrate in the method 1200 includes a dielectric layer, such as $SiO_2$, SiON, silicon nitride, a high-K dielectric, or combinations thereof. High-K dielectric layers herein include aluminum (Al), hafnium (Hf), lanthanum (La), or zirconium (Zr) based oxides, oxynitrides, and/or silicon nitrides ($Si_xN_y$), in single or layered structures (e.g., a $SiO_2$/high-k/$SiO_2$). In some embodiments, the second gas comprises a nitrogen containing gas, such as $NH_3$, the radical species comprise N, NH, $NH_2$, or combinations thereof, and exposing the substrate to the radical species includes exposing the dielectric layer to the radical species. In some embodiments, the first gas comprises a noble gas, such as argon, helium, neon, xenon, krypton, or a combination thereof. In some embodiments, the first gas comprises a noble gas, $N_2$, or a combination thereof.

Figure 13:
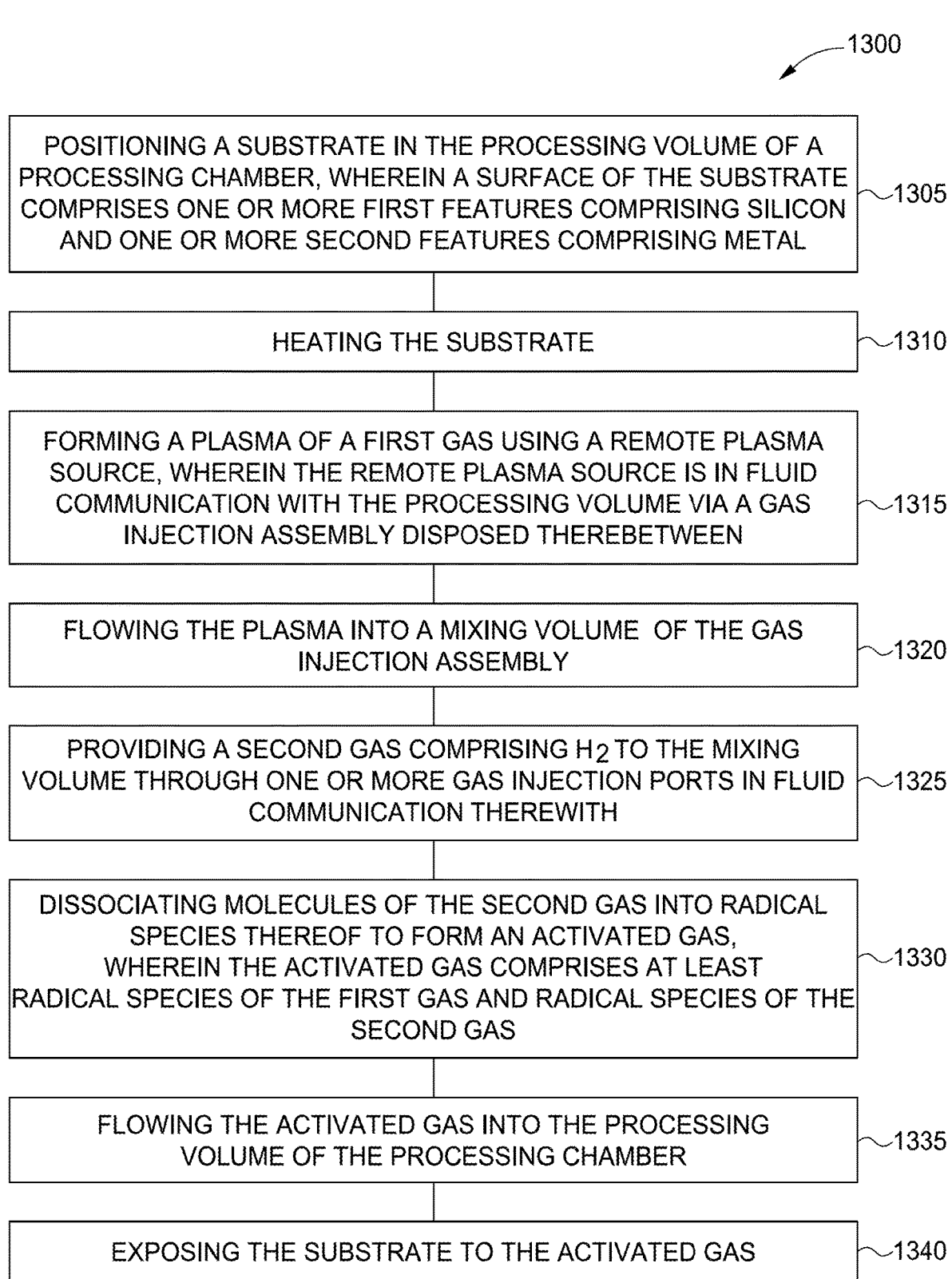
FIG. 13 is flow diagram of a method of selectively oxidizing a silicon containing surface of a substrate, according to embodiments of the disclosure.

FIG. 13 is flow diagram of a method 1300 of selectively oxidizing a silicon containing surface of a substrate, according to one embodiment. At operation 1305 the method 1300 includes positioning a substrate in the processing volume of a process chamber. A surface of the substrate comprises a plurality of features formed from silicon, such as amorphous silicon, polysilicon, and/or crystalline silicon, silicon nitride, or deposited silicon oxide (such as $SiO_2$ deposited by an ALD or CVD process), and a plurality of non-silicon features, such as features formed from metal, such as tungsten features. At operation 1310 the method 1300 includes heating the substrate by directing radiant energy theretowards. Herein, the substrate is heated to a temperature of less than about 1000° C., such as less than about 900° C., for example less than about 850° C., or less than about 800° C. In some embodiments, the substrate is heated to and/or maintained at a temperature between about 550° C. and about 650° C., for example about 600° C.

In some embodiments, the processing volume is maintained at a pressure less than about 5 Torr, such as less than about 3 Torr, for example about 1.5 Torr. At operation 1315 the method 1300 includes forming a plasma of a first gas or gas mixture using a remote plasma source. Herein, the first gas mixture comprises $O_2$ and $H_2$, where the $H_2$ is present in the first gas mixture at 20 atomic % or less. In another example of the first gas mixture, the ratio of $H_2$ molecules to $O_2$ molecules is between about 1:5 and about 1:4. In some embodiments, a ratio of $H_2$ to $O_2$ is less than about 1:4, such as less than about 1:5, less than about 1:10. In some embodiments, the first gas is substantially free of $H_2$. In some embodiments, the first gas further comprises an inert gas, such as argon, helium, krypton, or a combination thereof. At operation 1320 the method 1300 includes flowing the plasma into a mixing volume of a gas injection assembly disposed between the remote plasma source and the processing volume of the process chamber.

At operation 1325 the method 1300 includes flowing a second gas such as $H_2$ into the mixing volume through one or more gas injection ports formed in the body and liner of the gas injection assembly. At the operation 1325, a mixing plate according to an embodiment or combinations of embodiments is employed to flow the second gas into the chamber via the labyrinth of passages of the mixing plate. Herein, at operation 1330, the ions, radicals, and/or other charged particles of the plasma collide with the molecules of the second gas to dissociate the molecules of the second gas into radical molecular species and/or radical atomic species thereof. The plasma and the radical species of the second gas form an activated gas. Herein, by addition of sufficient $H_2$ to the stream of activated oxygen, and optionally hydrogen, coming from the remote plasma source, the atomic ratio of hydrogen to oxygen in the mixing volume and entering the process chamber is more than about 3:1, such as more than about 4:1, such as more than about 5:1, or between about 4:1 and about 10:1. Beneficially, the addition of hydrogen to the stream of activated oxygen, and optionally hydrogen, coming from the remote plasma source allows for increased activated hydrogen concentration from less than an atomic ratio of less than 1:4 (hydrogen:oxygen) useful to prevent damage to the RPS to more than about 3:1 in the activated gas flowing into the processing volume of the process chamber.

At operation 1335 the method 1300 includes flowing the activated gas into the processing volume (e.g., internal volume) of the process chamber. At operation 1340 the method 1300 includes exposing the substrate to the activated gas. In some embodiments, exposing the substrate to the activated gas oxidizes the plurality of features formed from materials including silicon to form $SiO_2$. In some embodiments of the method 1300, exposing the substrate to the activated gas oxidizes the plurality of features formed from materials including silicon with minimal or no oxidation of the plurality of non-silicon features, such as metal features.

FIG. 14 is a flow diagram of a method 1400 of providing atomic hydrogen to a surface of a substrate disposed in a processing volume of a process chamber, according to one embodiment. At operation 1405 the method 1400 includes positioning a substrate in the processing volume of a process chamber. The processing volume is fluidly coupled to a remote plasma source via a gas injection assembly disposed therebetween. At operation 1410 the method 1400 includes forming plasma of a first gas using the remote plasma source. Herein, the first gas comprises one or more noble gases, such as argon, helium, neon, xenon, krypton, or a combination thereof. In one embodiment, the first gas comprises argon. At operation 1415 the method 1400 includes flowing the plasma into a mixing volume of the gas injection assembly. At operation 1420 the method 1400 includes flowing a second gas such as hydrogen (e.g., $H_2$) into the mixing volume through one or more gas injection ports.

At operation 1420, a mixing plate according to an embodiment or combinations of embodiments is employed to flow the second gas into the chamber via the labyrinth of passages of the mixing plate. At operation 1425 the method includes dissociating the second gas into at least metastable radical molecular and/or radical atomic species thereof, such as atomic hydrogen, to form an activated gas. At operation 1430 the method includes flowing the activated gas into the processing volume of the process chamber. At operation 1435 the method 1400 includes exposing a surface of the substrate to the activated gas. In some embodiments, exposing the surface of the substrate to the activated gas cleans and/or hydrogen passivates the surface of the substrate before epitaxial growth of a layer thereon, such as an epitaxially grown silicon layer.

In another embodiment, the method 1400 further includes sequentially and cyclically exposing the substrate to a first precursor gas and a second precursor gas, herein the activated gas, to form a material layer thereon. In this embodiment, the method 1400 includes at least one cycle of exposing the substrate to the first precursor gas, where exposing the substrate to the first precursor gas comprises reacting the substrate surface with the first precursor gas to form a first layer. The method further includes exposing the substrate to the activated gas to form a second layer, where exposing the substrate to the activated gas comprises reacting the first layer with the activated gas to form a second layer, and where the second layer is hydrogen terminated. Herein, the activated gas is formed by forming a plasma of a first gas, for example argon, using the remote plasma source, flowing the plasma into a mixing volume of a gas injection assembly, and by flowing a second gas, such as $H_2$, into the mixing volume through one or more gas injection ports. The second gas is dissociated into at least metastable radical molecular and/or radical atomic species thereof, such as atomic hydrogen, to form an activated gas. In some embodiments, the method 1400 comprises a plurality of sequential cycles of exposing the substrate to the first precursor gas and exposing the substrate to the activated gas.

FIG. 15 is a flow diagram of a method 1500 of providing ozone ($O_3$) to the processing volume of a process chamber, according to one embodiment. At operation 1505 the method 1500 includes forming a plasma of a first gas using a remote plasma source, where the first gas comprises $O_2$, and where the remote plasma source is fluidly coupled to a processing volume of a process chamber via a gas injection assembly, such as any of the gas injection assemblies described in FIGS. 1-3. At operation 1510 the method 1500 includes flowing the plasma into a mixing volume of the gas injection assembly, wherein the plasma comprises at least radical atomic oxygen species. At operation 1515 the method 1500 includes flowing a second gas including $O_2$ molecules into the mixing volume to form an activated gas including $O_3$. At the operation 1515, a mixing plate according to an embodiment or combinations of embodiments is employed to flow the second gas into the chamber via the labyrinth of passages of the mixing plate. In one example, forming $O_3$ from the radical atomic oxygen species and the $O_2$ is a result of gas phase collisions therebetween. At operation 1520 the method 1500 includes flowing the activated gas into the processing volume of the process chamber. In some embodiments, the method 1500 further includes exposing a surface of a substrate to the activated gas, where the substrate is disposed in the processing volume of the process chamber. Further embodiments include a computer readable medium having instructions for any of the methods described in FIGS. 12-15 stored thereon.

In some embodiments discussed herein, the terms "vertical" and/or "horizontal" may be used to facilitate description of figures of the disclosure. However, it is contemplated that passages of embodiments herein may have orientations of passages other than "horizontal" or "vertical" with respect to a defined axis, even when the terms "horizontal" or "vertical" are specifically used in a description. Therefore, it is contemplated that use of the term "passage", without an orientation, is encompassed by the disclosure fully supports use of such term (without an orientation such as "horizontal" or "vertical") in the claims that follow. Moreover, it is contemplated that any use of "horizontal" or "vertical" does not necessarily define an orientation strictly parallel with a defined horizontal or vertical direction, but rather, merely indicates a general horizontal or vertical direction.

In an embodiment, a gas injection assembly, comprises a body; a dielectric liner disposed in the body, wherein the dielectric liner defines a mixing volume; a first flange to couple the gas injection assembly to a process chamber; a second flange to couple the gas injection assembly to a remote plasma source; and one or more gas injection ports formed through the body and the liner, wherein the liner comprises quartz, sapphire, or a combination thereof. Further in this example of a gas injection assembly, a length of the gas injection assembly, measured along a longitudinal axis thereof between a mounting surface plane of the first flange and a mounting surface plane of the second flange, is between about 25 mm and about 150 mm, and the liner, coaxially disposed in the body, has an inner diameter of between about 20 mm and about 60 mm. In this example, at least one of the one or more gas injection ports is located between about 20 mm and about 80 mm from the mounting surface of the first flange, the one or more gas injection ports have a diameter of between about 0.5 mm and about 6 mm, and the longitudinal axis of the gas injection assembly forms an angle with a longitudinal axis of a gas inlet port formed in the sidewall of the to be coupled process chamber, and wherein the angle is between about 10° and about 70°.

A method of processing a substrate, including: positioning a substrate in the processing volume of the process chamber, wherein the processing volume is in fluid communication with a remote plasma source via a gas injection assembly disposed therebetween; forming a plasma of a first gas in the remote plasma source; flowing the plasma into a mixing volume of the gas injection assembly; flowing a second gas to the mixing volume through one or more gas injection ports in fluid communication therewith; dissociating molecules of the second gas into radical species thereof; flowing the radical species into the processing volume of the process chamber; and exposing the substrate to the radical species. In an example of the method, the method further comprises heating the substrate to a temperature between about 500° C. and about 1100° C. by directing radiant energy towards a device side surface thereof, and device side surface comprises a dielectric layer, and wherein exposing the substrate to the radical species comprises exposing the dielectric layer to the radical species. Further in an embodiment of this method, second gas comprises $NH_3$ and the radical species comprise N, NH, $NH_2$, or combinations thereof and the first gas comprises a noble gas, $N_2$, or a combination thereof.

In an embodiment, a method of selectively oxidizing a surface of a substrate, comprises: positioning a substrate in the processing volume of a process chamber, wherein a surface of the substrate comprises a plurality of first features formed from materials including silicon and a plurality of second features formed from materials including metal; heating the substrate to less than about 800° C.; forming a plasma of a first gas using a remote plasma source, wherein the remote plasma source is in fluid communication with the processing volume via a gas injection assembly disposed therebetween, and wherein the first gas comprises 02 and less than about 20 atomic % $H_2$; flowing the plasma into a mixing volume of the gas injection assembly; flowing a second gas such as $H_2$ to the mixing volume through one or more gas injection ports in fluid communication therewith; dissociating molecules of the second gas into radical species thereof to form an activated gas, wherein the activated gas comprises at least radical species of the first gas and radical species of the second gas; flowing the activated gas into the processing volume of the process chamber; and exposing the surface of the substrate to the activated gas.

In an embodiment, a method of providing atomic hydrogen to a surface of a substrate, comprises: positioning the substrate in a processing volume of a process chamber, wherein the processing volume is fluidly coupled to a remote plasma source via a gas injection assembly disposed therebetween; forming a plasma of a first gas using the remote plasma source; flowing the plasma into a mixing volume of the gas injection assembly; flowing a second gas including hydrogen into the mixing volume through one or more gas injection ports; dissociating the second gas into an activated gas including atomic hydrogen; flowing the activated gas into the processing volume of the process chamber; and exposing a surface of the substrate to the activated gas. In an embodiment, the method further comprises exposing the surface of the substrate to a precursor gas before exposing the surface of the substrate to the activated gas, wherein exposing the surface of the substrate to the precursor gas comprises reacting the substrate surface with the first precursor gas to form a first layer, and wherein exposing the substrate to the activated gas comprises reacting the first layer with atomic hydrogen to form a hydrogen terminated second layer.

In an embodiment, a method of providing ozone to a processing volume of a process chamber, comprises: forming a plasma of a first gas using a remote plasma source, wherein the first gas comprises $O_2$, and wherein the remote plasma source is fluidly coupled to a processing volume of a process chamber via a gas injection assembly; flowing the plasma into a mixing volume of the gas injection assembly, wherein the plasma comprises at least radical atomic oxygen species; introducing a second gas including $O_2$ into the mixing volume to form an activated gas including $O_3$; and introducing the activated gas into the processing volume of the process chamber.

In an embodiment, a computer readable medium having instructions stored thereon for a method of processing a substrate. The method comprises positioning a substrate in the processing volume of the process chamber, wherein the processing volume is in fluid communication with a remote plasma source via a gas injection assembly disposed therebetween. The method also comprises forming a plasma of a first gas in the remote plasma source; flowing the plasma into a mixing volume of the gas injection assembly. The method also comprises flowing a second gas to the mixing volume through one or more gas injection ports in fluid communication therewith. The method also comprises dissociating molecules of the second gas into radical species thereof, and flowing the radical species into the processing volume of the process chamber. The method also comprises exposing the substrate to the radical species.

In an embodiment, a substrate processing system, comprises: a process chamber; a remote plasma source; and a gas injection assembly fluidly coupling the remote plasma source to the process chamber, wherein the gas injection assembly comprises: a body; a dielectric liner disposed in the body, wherein the dielectric liner defines a mixing volume; a first flange coupling the gas injection assembly to a sidewall of a process chamber; a second flange coupling the gas injection assembly to a remote plasma source; and one or more gas injection ports formed through the body and the liner.

While the foregoing is directed to embodiments of the present disclosure, other and further embodiments of the disclosure may be devised without departing from the basic scope thereof, and the scope thereof is determined by the claims that follow.

The invention claimed is:

1. A substrate processing system, comprising:
   a substrate process chamber;
   a gas inlet conduit coupled to a gas inlet of the process substrate process chamber;
   a mixing plate coupled to the gas inlet conduit with an elliptical opening in the mixing plate that registers with, and fluidly couples with, the gas inlet conduit, the mixing plate defining a plane, and the elliptical opening in the mixing plate formed perpendicular to the plane and defined by a wall, wherein the mixing plate comprises:
   a plurality of gas inlets formed in an outside edge of the mixing plate;
   a first gas path including;
      a first gas source conduit disposed in the mixing plate and connected to a first gas inlet of the plurality of gas inlets;
      a first gas passage formed within the mixing plate and fluidly coupled to the gas inlet conduit by a corresponding first opening formed in the wall; and
      a second gas passage formed within the mixing plate and fluidly coupled to the gas inlet conduit by a corresponding second opening formed in the wall;

a first passage coupling the first gas passage and the second gas passage to the first gas source conduit; and a second gas path including:

a second gas source conduit disposed in the mixing plate and connected to a second gas inlet of the plurality of gas inlets;

a third gas passage formed within the mixing plate and fluidly coupled to the gas inlet conduit by a corresponding third opening formed in the wall; and a fourth gas passage formed within the mixing plate and fluidly coupled to the gas inlet conduit by a corresponding fourth opening formed in the wall;

a second passage coupling the third gas passage and the fourth gas passage to second gas source conduit, wherein the first gas path and the second gas path are opposite each other and are disposed in a common plane; and a remote plasma source fluidly coupled to the elliptical opening in the mixing plate by a remote plasma conduit; and a gas source fluidly coupled to the first gas inlet and second gas inlet.

2. The substrate processing system of claim 1, wherein the first gas passage and the second gas passage are parallel.

3. The substrate processing system of claim 2, wherein the mixing plate has a central axis and the first gas passage and the second gas passage are on the same side of the central axis.

4. The substrate processing system of claim 2, wherein the mixing plate has a central axis, and wherein the first gas passage and the second gas passage are on opposite sides of the central axis.

5. A gas injection assembly, comprising:

a mixing plate with an outside edge having a plurality of gas inlets formed in the outside edge, a mixing plate opening formed through the mixing plate perpendicular to a major plane defined by the mixing plate, wherein the mixing plate opening is an elliptical opening and is defined by a wall and a plurality of gas openings are formed through the wall, wherein a plurality of gas paths fluidly couples each gas inlet of the plurality of gas inlets to a corresponding gas opening in the wall, wherein a first gas path of the plurality of gas paths includes: a first gas passage is disposed in the mixing plate, the first gas passage coupling a second gas passage of the plurality of gas passages and a third gas passage of the plurality of gas passages to a first gas inlet of the plurality of gas inlets, and a second gas path of the plurality of gas paths includes: a fourth gas passage is disposed in the mixing plate, the fourth gas passage coupling a fifth gas passage of the plurality of gas passages and a sixth gas passage of the plurality of gas passages to a second gas inlet of the plurality of gas inlets, wherein the first gas path and the second gas path are opposite each other and are disposed in a common plane.

6. The gas injection assembly of claim 5, wherein the mixing plate comprises a plurality of quadrants, wherein plurality of quadrants are defined by a first axis of the mixing plate and a second axis that is perpendicular to the first axis and intersects the first axis at a center of the mixing plate, wherein a first quadrant of the plurality of quadrants is adjacent to a second quadrant along the first axis, a third quadrant is adjacent to the second quadrant along the second axis, and a fourth quadrant is adjacent to the first quadrant along the first axis and adjacent to the third quadrant along the second axis, and wherein a first half of the mixing plate is defined by the first quadrant and the second quadrant and a second half of the mixing plate is defined by the third quadrant and the fourth quadrant, and wherein each half of the mixing plate has at least one of the plurality of gas passages.

7. The gas injection assembly of claim 6, wherein at least one quadrant of the plurality of quadrants does not have a gas passage of the plurality of gas passages.

8. The gas injection assembly of claim 6, wherein:

the first gas inlet and the first gas passage are located in the first half of the mixing plate, each of the first gas passage, the second gas passage and the third gas passage is located in the first half of the mixing plate and is fluidly coupled to a corresponding gas opening of the plurality of gas openings;

the second gas inlet located in the second half of the mixing plate;

the fourth gas passage fluidly coupled to the second gas inlet and located in the second half of the mixing plate;

the fifth gas passage fluidly coupled to the fourth gas passage; and the sixth gas passage fluidly coupled to the fourth gas passage, wherein each of the fourth gas passage and fifth gas passage are fluidly coupled to a corresponding gas opening of the plurality of gas openings.

9. The gas injection assembly of claim 6, wherein:

the fourth gas passage is fluidly coupled to the first gas passage, wherein each of the second gas passage, the third gas passage, and the fourth gas passage is in the first half of the mixing plate and fluidly coupled to a corresponding gas opening of the plurality of gas openings in the wall, and wherein the third gas passage is disposed between the second gas passage and the fourth gas passage and is on the first axis;

the second gas inlet of the plurality of gas inlets and a passage on the second half of the mixing plate;

the fifth gas passage fluidly coupled to the fourth gas passage;

the sixth gas passage fluidly coupled to the fifth gas passage in the second half of the mixing plate, the sixth gas passage aligned with the third gas passage along the first axis; and a seventh gas passage fluidly coupled to the fifth gas passage in the second half of the mixing plate, wherein each of the sixth and seventh gas passages and is fluidly coupled to a corresponding gas opening of the plurality of gas openings.

10. The gas injection assembly of claim 9, wherein:

each of the second gas passage and third gas passage is fluidly coupled to a different gas opening of the plurality of gas openings;

the fourth gas passage fluidly coupled to the second gas inlet, wherein the fourth gas passage extends from the third quadrant to the fourth quadrant;

the fifth gas passage located in the third quadrant and fluidly coupled to the fourth gas passage; and the sixth gas passage located in the third quadrant and fluidly coupled to the fourth gas passage, wherein each of the fifth gas passage and sixth gas passage is fluidly coupled to a different gas opening of the plurality of gas openings.

11. The gas injection assembly of claim 10, wherein the second gas passage and the third gas passage are perpendicular to the first gas passage, and wherein the gas passages of the first quadrant are not aligned along a common axis with the gas passages of the third quadrant.

12. The gas injection assembly of claim 6, wherein:
the second inlet is formed in the outside edge of the mixing plate along the first axis;
the fourth gas passage of the plurality of gas passages is fluidly coupled to the second inlet, wherein the fourth gas passage is located in the third quadrant;
the fifth gas passage is located in the third quadrant and fluidly coupled to the fourth gas passage; and
the sixth gas passage located in the third quadrant and fluidly coupled to the fourth gas passage, wherein each of the fifth and sixth gas passages is fluidly coupled to a different gas opening of the plurality of gas openings.

13. The gas injection assembly of claim 6, wherein:
the first gas passage extends from the first quadrant to the second quadrant;
the second gas passage is located in the first quadrant;
the third gas passage is located in the second quadrant;
the fourth gas passage is fluidly coupled to the fifth gas passage located in the first quadrant;
the sixth gas passage is located along the first axis fluidly coupled to the fourth gas passage; and
a seventh gas passage is located in the second quadrant, wherein each of the fourth gas passage, the fifth gas passage, and the sixth gas passage are coupled to a different gas opening of the plurality of gas openings.

14. The gas injection assembly of claim 13, wherein:
the second gas inlet is formed in the outside edge of the mixing plate and located on the first axis;
an eighth gas passage of the plurality of gas passages extends from the third quadrant to the fourth quadrant and is coupled to the second gas inlet;
a ninth gas passage is located in the third quadrant and fluidly coupled to the eighth gas passage and a gas opening of the plurality of gas openings; and
a tenth gas passage located in the fourth quadrant that is fluidly coupled to the eighth gas passage and a gas opening of the plurality of gas openings, wherein the ninth and the tenth gas passages are formed equidistant from the first axis.

15. The gas injection assembly of claim 13, wherein:
an eighth gas passage of the plurality of gas passages extends from the third quadrant to the fourth quadrant and is coupled to a second gas inlet formed in the outside edge of the mixing plate;
a ninth gas passage in the fourth quadrant is fluidly coupled to the eighth gas passage;
a tenth gas passage extends from the third quadrant to the fourth quadrant and is fluidly coupled to the ninth gas passage;
an eleventh gas passage extends along the first axis and is fluidly coupled to a one of the gas openings of the plurality of gas openings; and
a twelfth gas passage in the third quadrant is fluidly coupled to the tenth gas passage and one of the gas openings of the plurality of gas openings.

16. A gas injection assembly, comprising:
a mixing plate defined by a plurality of quadrants and an outside edge;
a plurality of gas inlets formed in the outside edge;
a mixing plate opening formed perpendicularly through a plane defined parallel to the mixing plate, wherein the opening is an elliptical opening and a first axis is parallel to the plane, wherein the opening is defined by a wall and a plurality of gas openings are formed through the wall; and
a plurality of gas paths fluidly coupling each gas inlet of the plurality of gas inlets to a corresponding gas opening of the plurality of gas openings, a first gas path of the plurality of gas paths includes: at least a first gas passage of the plurality of gas passages and a second gas passage of the plurality of gas passages are coupled to a first gas inlet of the plurality of gas inlets by a first passage within the mixing plate, and a first gas path of the plurality of gas paths includes: at least a third gas passage of the plurality of gas passages and a fourth gas passage of the plurality of gas passages are coupled to a second gas inlet of the plurality of gas inlets by a second passage within the mixing plate, wherein the first gas path and the second gas path are opposite each other and are disposed in a common plane.

17. The gas injection assembly of claim 16, further comprising:
a first quadrant of the plurality of quadrants adjacent to a second quadrant along the first axis;
a third quadrant adjacent to the second quadrant along a second axis;
a fourth quadrant adjacent to the first quadrant along the second axis and adjacent to the third quadrant along the first axis, wherein a first half of the mixing plate is defined by the first quadrant and the second quadrant and a second half of the mixing plate is defined by the third quadrant and the fourth quadrant, wherein the first gas passage is defined in the first half of the mixing plate and the second gas passage is defined in the second half of the mixing plate;
wherein the first passage comprises a first portion and a second portion, wherein the first portion is perpendicular to the first gas passage and extends from the first quadrant to the second quadrant, and the second portion is located in the second quadrant at an angle from 120 degrees to about 150 degrees relative to the first portion;
the fourth gas passage fluidly coupled to the first portion of the third gas passage, aligned with the first axis, and coupled to a first gas opening of the plurality of gas openings; and
a fifth gas passage fluidly coupled to the second portion of the third gas passage and coupled to a second gas opening of the plurality of gas openings.

18. The gas injection assembly of claim 17, wherein the fifth gas passage is perpendicular to the second portion of the first passage.

19. The gas injection assembly of claim 18, further comprising:
a sixth gas passage fluidly coupled to the second gas passage, wherein the sixth gas passage comprises a first portion that extends from the third quadrant to the fourth quadrant and a second portion formed in the fourth quadrant.

20. The gas injection assembly of claim 19, further comprising:
a seventh gas passage fluidly coupled to the second portion of the sixth gas passage and coupled to a third gas opening of the plurality of gas openings; and
an eighth gas passage that is fluidly coupled to the first portion of the sixth gas passage, aligned with the first axis, and coupled to a gas opening of the plurality of gas openings.

* * * * *